(12) United States Patent
Hawryluk et al.

(10) Patent No.: US 9,401,278 B2
(45) Date of Patent: Jul. 26, 2016

(54) APPARATUS AND METHODS FOR IMPROVING THE INTENSITY PROFILE OF A BEAM IMAGE USED TO PROCESS A SUBSTRATE

(71) Applicant: Ultratech, Inc., San Jose, CA (US)

(72) Inventors: Andrew M Hawryluk, Los Altos, CA (US); Boris Grek, Hayward, CA (US); David A Markle, Saratoga, CA (US)

(73) Assignee: Ultratech, Inc., San Jose, CA (US)

( * ) Notice: Subject to any disclaimer, the term of this patent is extended or adjusted under 35 U.S.C. 154(b) by 132 days.

(21) Appl. No.: 14/253,570

(22) Filed: Apr. 15, 2014

(65) Prior Publication Data

US 2014/0227890 A1 Aug. 14, 2014

Related U.S. Application Data

(62) Division of application No. 13/354,300, filed on Jan. 19, 2012, now Pat. No. 8,742,286, which is a division of application No. 12/381,061, filed on Mar. 6, 2009, now Pat. No. 8,153,930, which is a division of application No. 11/476,275, filed on Jun. 28, 2006, now Pat. No. 7,514,305.

(51) Int. Cl.
*H01L 21/00* (2006.01)
*H01L 21/263* (2006.01)
*H01L 21/67* (2006.01)

(52) U.S. Cl.
CPC ...... *H01L 21/2636* (2013.01); *H01L 21/67115* (2013.01); *H01L 21/67248* (2013.01)

(58) Field of Classification Search
CPC .............. H01L 21/2636; H01L 21/67248; H01L 21/67115
See application file for complete search history.

(56) References Cited

U.S. PATENT DOCUMENTS

| | | | |
|---|---|---|---|
| 5,003,567 A | 3/1991 | Hawryluk et al. | |
| 6,531,681 B1 | 3/2003 | Markle et al. | 219/121.8 |
| 6,747,245 B2 * | 6/2004 | Talwar | B23K 26/032 219/121.8 |
| 6,791,060 B2 * | 9/2004 | Dunsky | B23K 26/0732 219/121.7 |
| 6,861,614 B1 * | 3/2005 | Tanabe | B23K 26/04 219/121.66 |
| 7,154,066 B2 * | 12/2006 | Talwar | B23K 26/032 219/121.65 |
| 7,157,660 B2 * | 1/2007 | Talwar | B23K 26/032 219/121.63 |
| 7,312,418 B2 * | 12/2007 | Tanabe | B23K 26/04 219/121.65 |
| 7,399,945 B2 * | 7/2008 | Talwar | B23K 26/032 219/121.66 |
| 7,403,284 B2 * | 7/2008 | Grek | G01J 3/02 356/246 |
| 7,440,655 B2 * | 10/2008 | Grek | G02B 6/12016 385/37 |

(Continued)

*Primary Examiner* — Laura Menz
(74) *Attorney, Agent, or Firm* — Allston L. Jones; Peters Verny, LLP

(57) ABSTRACT

Methods and apparatuses are provided for improving the intensity profile of a beam image used to process a semiconductor substrate. At least one photonic beam may be generated and manipulated to form an image having an intensity profile with an extended uniform region useful for thermally processing the surface of the substrate. The image may be scanned across the surface to heat at least a portion of the substrate surface to achieve a desired temperature within a predetermined dwell time. Such processing may achieve a high efficiency due to the large proportion of energy contained in the uniform portion of the beam.

11 Claims, 13 Drawing Sheets

(56) References Cited

U.S. PATENT DOCUMENTS

| | | | |
|---|---|---|---|
| 7,514,305 B1* | 4/2009 | Hawryluk | H01L 21/67115 438/166 |
| 7,639,908 B2* | 12/2009 | Das | G02B 6/12011 385/24 |
| 7,840,104 B2* | 11/2010 | Das | G02B 6/12016 385/15 |
| 7,847,213 B1* | 12/2010 | Anikitchev | B23K 26/06 219/121.61 |
| 8,153,930 B1* | 4/2012 | Hawryluk | H01L 21/67115 219/121.65 |
| 8,742,286 B1* | 6/2014 | Hawryluk | H01L 21/67115 219/121.65 |
| 2003/0213787 A1* | 11/2003 | Dunsky | B23K 26/0732 219/121.75 |
| 2004/0084427 A1* | 5/2004 | Talwar | B23K 26/032 219/121.73 |
| 2004/0173585 A1* | 9/2004 | Talwar | B23K 26/032 219/121.63 |
| 2004/0188396 A1* | 9/2004 | Talwar | B23K 26/032 219/121.65 |
| 2005/0067384 A1 | 3/2005 | Talwar et al. | 219/121.6 |
| 2005/0103998 A1 | 5/2005 | Talwar et al. | 250/340 |
| 2005/0109743 A1* | 5/2005 | Tanabe | B23K 26/04 219/121.73 |
| 2005/0177315 A1 | 8/2005 | Ghosh | |
| 2006/0091120 A1* | 5/2006 | Markle | B23K 26/032 219/121.65 |
| 2006/0132764 A1* | 6/2006 | Grek | G01J 3/02 356/317 |
| 2007/0051708 A1* | 3/2007 | Talwar | B23K 26/032 219/121.75 |
| 2007/0065076 A1* | 3/2007 | Grek | G02B 6/12026 385/37 |
| 2007/0166945 A1* | 7/2007 | Tanabe | B23K 26/04 438/401 |
| 2009/0016679 A1* | 1/2009 | Das | G02B 6/12016 385/37 |
| 2009/0185806 A1* | 7/2009 | Das | G02B 6/12011 398/68 |
| 2010/0084744 A1* | 4/2010 | Zafiropoulo | B23K 26/0608 257/618 |
| 2011/0298093 A1* | 12/2011 | Zafiropoulo | B23K 26/0608 257/618 |
| 2012/0111838 A1 | 5/2012 | Zafiropoulo et al. | |
| 2014/0227890 A1* | 8/2014 | Hawryluk | H01L 21/67115 438/799 |

* cited by examiner

APPARATUS AND METHODS FOR IMPROVING THE INTENSITY PROFILE OF A BEAM IMAGE USED TO PROCESS A SUBSTRATE

RELATED APPLICATIONS

This Application is a division of U.S. patent application Ser. No. 13/354,300 filed on Jan. 19, 2012, which is a division of U.S. patent application Ser. No. 12/381,061 filed on Mar. 6, 2009, which is a division of U.S. patent application Ser. No. 11/476,275 filed on Jun. 28, 2006.

BACKGROUND OF THE INVENTION

1. Field of Invention

The present invention relates to semiconductor processing methods and apparatuses that use one or more photonic beams having an initially nonuniform intensity profile to generate an image, which, in turn, is scanned across a surface of a semiconductor substrate. In particular, the invention relates to such methods and apparatuses in which the image exhibits a uniform intensity profile over a useful portion thereof such that energy utilization of the beam is increased.

2. Description of Background Art

Fabrication of semiconductor-based microelectronic devices such as processors, memories and other integrated circuits (ICs) often involves subjecting a semiconductor substrate to numerous processes, such as photoresist coating, photolithographic exposure, photoresist development, etching, polishing, and heating or "thermal processing". In certain applications, thermal processing is performed to activate dopant atoms implanted in junction regions (e.g., source and drain regions) of the substrate. For example, the source/drain parts of transistors may be formed by exposing regions of a silicon wafer to electrostatically accelerated dopants containing either boron, phosphorous or arsenic atoms. After implantation, the dopants are largely interstitial, do not form part of the silicon crystal lattice, and are electrically inactive. Activation of these dopants may be achieved by annealing the substrate.

Annealing may involve heating the entire substrate to a particular processing temperature for a period of time sufficient for the crystal lattice to incorporate the impurity atoms in its structure. The required time period depends on the processing temperature. Particularly during an extended time period, the dopants tend to diffuse throughout the lattice. As a result, the dopant distribution profile may change from an ideal box shape to a profile having a shallow exponential fall-off.

By employing higher annealing temperatures and shorter annealing times it is possible to reduce dopant diffusion and to retain the dopant distribution profile achieved after implant. For example, thermal processing (TP) encompasses certain techniques for annealing source/drain regions formed in silicon wafers as part of the process for fabricating semiconductor devices such as integrated circuits (ICs). An objective of rapid thermal processing (RTP) is to produce shallow doped regions with very high conductivity by rapidly heating the wafer to temperatures near the semiconductor melting point to incorporate dopants at substitutional lattice sites, and then rapidly cool the wafer to "freeze" the dopants in place. RTP is particularly useful in the context of semiconductor-based microelectronic devices with decreased feature sizes, because it tends to produce low-resistivity doped regions, which translates into faster ICs. It also results in an abrupt change in dopant atom concentration with depth as defined by the implant process, since thermal diffusion plays only a very minor role in the rearrangement of the impurity atoms in the lattice structure.

Laser-based technologies have been employed to carry out TP on time scales much shorter than those employed by conventional RTP systems. Exemplary terminology used to describe laser based TP techniques include laser thermal processing (LTP), laser thermal annealing (LTA), and laser spike annealing (LSA). In some instances, these terms can be used interchangeably. In any case, these techniques typically involve forming a laser beam into a long, thin image, which in turn is scanned across a surface to be heated, e.g., an upper surface of a semiconductor wafer. For example, a 0.1-mm wide beam may be raster scanned over a semiconductor wafer surface at 100 mm/s to produce a 1-millisecond dwell time for the heating cycle. A typical maximum temperature during this heating cycle might be 1350° C. Within the dwell time needed to bring the wafer surface up to the maximum temperature, a layer only about 100 to about 200 micrometers below the surface region is heated. Consequently, the bulk of the millimeter thick wafer serves to cool the surface almost as quickly as it was heated once the laser beam is past. Additional information regarding laser-based processing apparatuses and methods can be found in U.S. Pat. No. 6,747,245 and U.S. Patent Application Publication Nos. 2004/0188396, 2004/0173585, 2005/0067384, and 2005/0103998 each to Talwar et al.

LTP may employ either pulsed or continuous radiation. For example, conventional LTP may use a continuous, high-power, $CO_2$ laser beam, which is raster scanned over the wafer surface such that all regions of the surface are exposed to at least one pass of the heating beam. The wavelength of the $CO_2$ laser, A, is 10.6 μm in the infrared region. This wavelength, large relative to the typical dimensions of wafer features, can be uniformly absorbed as the beam scans across a patterned silicon wafer resulting in each point on the wafer being subject to very nearly the same maximum temperature.

Similarly, a continuous radiation source in the form of laser diodes may be used in combination with a continuous scanning system. Such laser diodes are described in U.S. Pat. No. 6,531,681, entitled "Apparatus Having Line Source of Radiant Energy for Exposing a Substrate", which issued on Mar. 11, 2003 and is assigned to the same assignee as this application. Laser diode bar arrays can be obtained with output powers in the 100 W/cm range and can be imaged to produce line images about a micrometer wide. They are also very efficient at converting electricity into radiation. Further, because there are many diodes in a bar each operating at a slightly different wavelength, they can be imaged to form a uniform line image.

An alternate method of annealing employs a pulsed laser to illuminate an extended area and a step-and-repeat system. In this case, a more uniform temperature distribution can be obtained with a longer radiation pulse (dwell time) since the depth of heating is greater and there is more time available during the pulse interval for lateral heat conduction to equalize temperatures across the circuit. However, longer dwell times require more pulse energy. Pulse lengths with periods longer than a microsecond and covering circuit areas of 5 cm² or more are not typically feasible because the energy per pulse becomes too high. While technically possible, the laser and associated power supply needed to provide such a high-energy pulse will likely be impractically big and expensive.

In general, illumination uniformity (both macro- and micro-uniformity) over the useable portion of the exposure image is a highly desirable trait. This ensures that the corresponding heating of the substrate is equally uniform. Similarly, the energy delivered in each beam pulse should be stable so that all exposed regions are successively heated to a uniform temperature. In such a system, the size of the uniformly illuminated area may be adjusted to contain an integer number of circuits. In addition, the illumination fall-off beyond the edge of the usable portion of the exposure image is preferably sufficiently sharp, so that there is no appreciable exposure of adjacent circuits on the substrate. Defining the edges of the illumination pattern with a resolution of about 50 microns is usually sufficient since the scribe lines separating adjacent circuits are typically at least that wide.

Certain "nonmelt" LTP techniques involve shaping the beam from a continuous $CO_2$ laser to form an image of about 0.12 mm wide and over 10 mm long, which is incident on the wafer at Brewster's angle (~75° incidence). It is desirable to have the beam incidence angle contained in a plane normal to the wafer surface and aligned with the length of the image. The beam is scanned over the substrate in a direction perpendicular to its long direction. Even if a beam intensity uniformity of 1% can be achieved over the length of the image, this results in a corresponding 10° C. or 14° C. temperature difference along the beam depending on whether the background substrate temperature starts at 400° C. or room temperature, respectively.

In some instances, then, e.g., for semiconductor annealing applications, a highly uniform intensity along the length of the beam, e.g., to about 1%, may be desired. In this case if a beam having a Gaussian intensity profile is employed, only the central portion of the beam that exhibits a substantially uniform intensity, e.g., to about 1% or less, may be used. This useful portion contains only about 11% of the total energy in the beam. The remaining energy may be wasted or may contribute to undesirable heating of adjacent regions.

Thus, opportunities exist in the art to improve the performance of TP techniques to overcome the drawbacks associated with known LTP techniques that involve the use of one or more radiation beams having a nonuniform intensity profile. In addition, there exist opportunities in the art to meet the need for LTP technologies that exhibit improved energy utilization.

SUMMARY OF THE INVENTION

The invention provides methods and apparatuses for processing a semiconductor substrate having a surface with radiation. In one embodiment, the inventive method involves generating at least one photonic beam having a nonuniform intensity profile and using the at least one photonic beam to form an image on the substrate surface. The image may exhibit a uniform intensity profile over a useful portion thereof and the proportion of energy in the useful portion relative to the rest of the image may be a measure of the energy utilization. In addition, the image may be scanned across the substrate surface to achieve a desired temperature within a predetermined dwell time, D.

In some instances, the at least one photonic beam is manipulated to render at least a portion of its intensity profile more uniform. For example, the intensity profile of the beam may initially be substantially Gaussian, possibly with some contributions from higher order modes. After manipulation, the beam may form a line image having an intensity profile along its length more boxcar in shape. Beam manipulation is particularly suited for methods that start with a single photonic beam having a nonuniform intensity profile.

Two or more photonic beams may be used to form a single contiguous image. In such a case, some or all input beams may have a nonuniform intensity profile and the combination a uniform intensity profile over a useful portion thereof that is longer than provided by any of the input beams.

When a plurality of beams is used, it is often, but not always, preferable that the beams be combined in a substantially noninterfering manner to form a contiguous image. A number of techniques may be used to avoid the adverse consequences of substantial beam interference. For example, interference between two beams forming a contiguous image may be effectively avoided if their frequencies are varied so that the transitory period when the frequencies are sufficiently close to create significant interference effects is a small fraction of the dwell time. In this case the net result on the peak temperature, which depends on the intensity integrated over the whole dwell time period, is likely to be negligible. In addition or in the alternative, each beam may have a wavelength that is locked relative to another with a frequency difference separating the beams that is much greater than 1/D.

Regardless of the number of beams used to create the image on the substrate, the useful portion of the image is the portion in close proximity to the peak intensity having a substantially uniform intensity profile. The useful portion typically contains a peak intensity and the intensity profile of the useful portion may be entirely within a range of about 98% to 100% of the peak intensity. Optionally, the intensity profile may be entirely within about 99% to 100% of the peak intensity.

The invention is typically used to effect rapid semiconductor annealing. Accordingly, the desired temperature is typically sufficient to electrically activate dopant atoms implanted or otherwise placed into a semiconductor material. For silicon, the desired temperature may be at least about 1300° C. and lower than silicon's melting point.

For rapid annealing, either pulsed or continuous beams may be used having a predetermined dwell time of no more than about 10 milliseconds. Such short dwell times may involve using a beam having an average power of at least 250 W, 1000 W, 3,500 W, or more depending on the dwell time and the image size. Higher beam energy utilization is preferred for a number of reasons, e.g., to reduce the laser power requirements and to increase the throughput of the tool. Accordingly, it is desirable to achieve an energy utilization of at least 15%, 25%, 35%, and preferably more. Optionally, one or more beams may be incident to the substrate surface at or near the surface's Brewster's angle.

In another embodiment, an apparatus is provided for processing a substrate having a surface. The apparatus may include a radiation source adapted to emit a photonic beam of a nonuniform intensity profile and a stage adapted to support a substrate having a surface. An optical system may be adapted to receive the emitted beam and create therefrom an image on the substrate surface. A controller may be operably coupled to the radiation source and the stage. The image may exhibit a uniform intensity profile over a useful portion thereof such that energy utilization of the beam is high. The controller is programmed to provide relative movement between the stage and the beam to scan the image across the substrate surface to heat at least a portion of the substrate surface to achieve a desired temperature within a predetermined dwell time, D.

Optionally, a plurality of radiation sources may be used, and the optical system may be adapted to receive and combine beams from the sources to form a contiguous image on the substrate surface. A number of means may be used to ensure that the beams do not substantially interfere with each other. For example, the cavity length of each laser may be modulated at a different frequency so the period of time that any two laser frequencies correspond is very short compared to the dwell time. This condition may be satisfied when the cavity mirror modulation frequency difference from laser-to-laser (Δf) is greater than 1/D and the modulation amplitude is sufficient to produce a shift in laser frequency corresponding to or greater than 9000(Δf). In order to suppress diffraction from the apertures used to combine the beams it is necessary to combine the beams near their waist positions and provide a beam separation distance of at least six times the $1/e^2$ waist intensity radius between beams. In addition or in the alternative, when a radiation source is a laser, the laser may have a variable cavity length. In such a case, the controller may be programmed to provide variations in cavity length in a manner effective to produce a laser-to-laser wavelength change frequency that substantially reduces or eliminates adverse interference effects. Laser diode technology may be used as well to provide all of the energy for annealing or to supplement the beam from a single large laser.

Regardless of how many radiation sources are used, variations on the optical system may be used. For example, the optical system may include a reflective aspheric element having a surface adapted to transform the non-uniform intensity profile of a photonic beam emitted from the radiation source into a uniform image on the substrate surface. The aspheric surface may be fixed or adjustable. Means may be provided for altering beam size and position on the reflective aspheric and the aspheric element may have an adjustable surface profile.

In addition or in the alternative, the optical system may include a refractive element. Furthermore, the optical system may include an array of waveguides. Waveguides may be arranged to alter the nonuniform intensity profile of photonic beam emitted from the radiation source to create the image on the substrate surface.

In any case, the optical system is typically configured to create from the emitted beam a line image having a lengthwise axis on the substrate surface. In addition, the stage is typically adapted to hold the substrate in a position to receive radiation from the optical system at an incident angle greater than 45°. The beam forming optical system may be arranged so that the incident angle is contained in a plane normal to the substrate surface and containing the lengthwise axis of the image.

Figure 1:
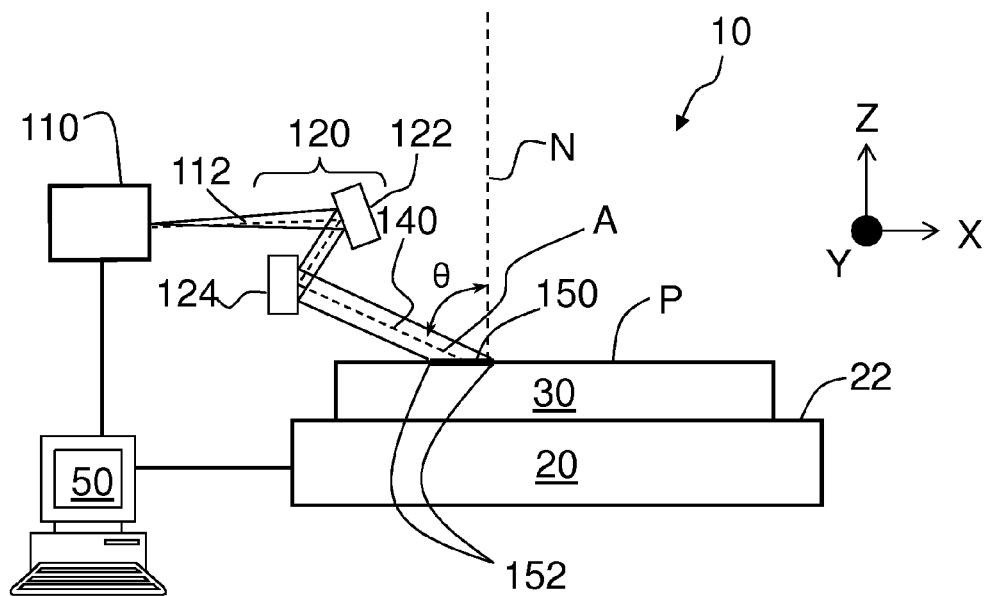
FIG. 1 schematically illustrates an exemplary single-laser thermal process apparatus for effecting rapid thermal processing of a substrate that may be used with the invention.

The drawings are intended to illustrate various aspects of the invention, which can be understood and appropriately carried out by those of ordinary skill in the art. The drawings may not be to scale as certain features of the drawings may be exaggerated for emphasis and/or clarity of presentation.

DETAILED DESCRIPTION OF THE INVENTION

Definitions and Overview

Before describing the present invention in detail, it is to be understood that this invention, unless otherwise noted, is not limited to specific substrates, temperature measuring means, or materials, all of which may vary. It is also to be understood that the terminology used herein is for the purpose of describing particular embodiments only, and is not intended to be limiting.

It must be noted that, as used in this specification and the appended claims, the singular forms "a", "an" and "the" include both singular and plural referents unless the context clearly dictates otherwise. Thus, for example, reference to "a beam" includes a plurality of beams as well as a single beam, reference to "a wavelength" includes a range or plurality of wavelengths as well as a single wavelength, reference to "a region" includes a combination of regions as well as single region, and the like.

In describing and claiming the present invention, the following terminology will be used in accordance with the following definitions.

The term "apodization" is generally used to describe the manipulation of the amplitude and/or phase of a photonic beam, typically for the purpose of producing a more desirable image. As a related matter, the term "aspheric" is used to describe an optical element having a surface that departs from being flat, spherical or cylindrical and which may serve to correct undesirable optical aberrations or to produce desired intensity profiles in beams or images. For example, an "aspheric surface" may have a surface profile that generally follows the shape of a "w", and that may serve to render the intensity profile of an image more uniform.

The terms "Brewster's angle" or "Brewster angle" is used to refer to the angle of incidence between a radiation beam and a dielectric surface that corresponds to the minimum or near-minimum reflectivity of the P-polarized component of the beam. Films on the surface of an object, such as a silicon wafer, may prevent it from exhibiting zero reflectivity at any angle. If, however, the films are dielectric in nature, then there generally will be an angle of minimum reflectivity for P-polarized radiation. Accordingly, the Brewster's angle as used herein for a specular surface formed from a variety of different dielectric films stacked on a substrate can be thought of as an effective Brewster's angle, or the angle at which the reflectivity of P-polarized radiation is at a minimum. This minimum angle typically coincides with or is near the angle of the Brewster's angle for the substrate material.

The term "energy utilization" as in the "energy utilization of an image" refers to the proportion of energy associated with the portion of the image useful for producing a desired effect relative to the total beam energy in the image. For example, in an annealing application the "useful portion" of an image may be only that part of the beam that comes within about a percent or two of the maximum or peak beam intensity. A small modification to the image profile shape can produce a large change in the "energy utilization".

The term "intensity profile" in reference to an image or a beam refers to the distribution of radiation intensity along one or more dimensions. For example, an image may have a useful portion and a nonuseful portion. The useful portion of an image typically has a "uniform" intensity profile that exhibits substantially the same intensity. In other word, the intensity profile integrated in the scan direction throughout the useful portion of the image may be substantially constant. Accordingly, any point on a substrate surface region that is scanned by a useful portion of an image having a uniform intensity profile will be heated to the same temperature. However, the intensity or intensity profile of the nonuseful portion may differ from that of the useful portion. Thus, the image as a whole may have an overall "nonuniform" intensity profile even though a useful portion by itself may exhibit a uniform intensity profile.

As a related matter, the term "peak intensity value" of an image or a beam refers to the point of highest intensity in the image or beam. Typically, the entirety of the useful portion of an image will exhibit the peak intensity.

The term "light emitting photodiode (LED)" refers to a diode that is typically made from semiconductor material, and which converts an applied voltage to photonic radiation. The terms "diode" and "LED" are generally interchangeably used herein, however this is not to be confused with the term "photodiode", which may refer to a photo-detector that converts incident radiation into an electrical current. The term "laser diode" refers to a type of LED that emits coherent light when forward biased.

The term "semiconductor" is used to refer to any of various solid substances having electrical conductivity greater than insulators but less than good conductors, and that may be used as a base material for computer chips and other electronic devices. Semiconductors include elements such as silicon and germanium and compounds such as silicon carbide, aluminum phosphide, gallium arsenide, and indium antimonide. Unless otherwise noted, the term "semiconductor" includes any one or a combination of elemental and compound semiconductors, as well as strained semiconductors, e.g., semiconductors under tension or compression. Exemplary indirect bandgap semiconductors suitable for use with the invention include Si, Ge, and SiC. Direct bandgap semiconductors suitable for use with the invention include, for example, GaAs, GaN, and InP.

The terms "substantial" and "substantially" are used in their ordinary sense and refer to matters that are considerable in importance, value, degree, amount, extent or the like. For example, the phrase "substantially Gaussian in shape" refers to a shape that corresponds predominantly to the shape of a Gaussian probability distribution curve. However, a shape that is "substantially Gaussian" may exhibit some characteristics of a non-Gaussian curve as well, e.g., the curve may also include a component described by a polynomial. Similarly, a "substantially uniform" intensity profile will contain a relatively flat portion where the intensity does not deviate more than a few percent from the profile's peak intensity. Preferably, the intensity deviation is less than about 2%. Optimally, the intensity deviation is no more than about 1% or no more than about 0.8%. Other uses of the term "substantially" involve an analogous definition.

The term "substrate" as used herein refers to any material having a surface, which is intended for processing. The substrate may be constructed in any of a number of forms, for example, such as a semiconductor wafer containing an array of chips, etc.

In general, the invention involves processing methods and apparatuses that use one or more photonic beams having, in some cases, a nonuniform intensity profile. While the invention may be practiced using one or more photonic beams having an arbitrary intensity profile, the invention is particularly suited for high-power photonic beams such as those generated by a laser that exhibit a substantially Gaussian intensity profile. The one or more high-power beams, e.g., having a power of at least 250 W, 1000 W, or 3500 W, may be used to generate an image, which, in turn, is scanned across a surface of a substrate to effect rapid thermal processing, e.g., melt or nonmelt processing, of the substrate surface. Such powers may provide exposure energy doses of at least about 0.1 or about 0.5 J/cm$^2$ to about 1 J/cm$^2$ over a dwell time. These methods and apparatuses are particularly suited for annealing semiconductor wafers containing microelectronic devices such as processor and memory chips.

The invention represents an improvement over known technologies in that it provides a more uniform processing image intensity profile. In particular, an image generated using the invention may exhibit a greater useable portion than an image generated without using the invention. As a result, energy utilization of the beam may be increased. For example, the invention may increase energy utilization by 30%, 100% or more. Such increased energy utilization tends to result in improved performance from a throughput perspective, whereas better uniformity may improve performance from a quality perspective. Increased energy utilization and uniformity may serve to improve overall performance in a synergistic manner.

To provide context to the nature of the invention, it should be noted that LTP typically involves rapidly heating a wafer surface to temperatures near the semiconductor melting point, e.g., to at least about 1300° C. in the case of silicon wafers, to incorporate dopants at substitutional lattice sites. Then, the wafer is rapidly cooled to "lock" the dopants in place where they are electrically active. This activation process can be carried out, for example, by a pulsed laser and a step-and-repeat stage motion, or by a continuous laser and a scanning stage. The beam from the pulsed laser is generally shaped to cover an area encompassing a number of circuits, whereas the scanned beam is usually shaped into a long, narrow beam under which the substrate can be scanned in a direction orthogonal to the long direction. The dwell time may be determined by the duration of the laser pulse or the width of the laser beam divided by the scanning velocity. With sufficiently short dwell times, only a shallow region just below the surface is heated to high temperature, and the bulk of the wafer serves to cool the region almost as quickly as it was heated.

When the beam image on the substrate has a nonuniform intensity profile, the surface temperature and the resultant thermal processing is also nonuniform. Over-heating the surface generally results in irreparable damage so this is not a viable option for thermal processing. Thus, for an image with a Gaussian intensity profile, effectively only the central portion of the image with the highest intensity can serve as a useful portion for thermal processing. For example, if a 1% annealing uniformity is required then the proportion of energy associated with the useful central portion is about 11% of the total energy in the Gaussian image, and about 89% of the total beam energy, is effectively wasted. In other words, a typical energy utilization of a beam image having a Gaussian intensity profile used for thermal processing of a semiconductor wafer is less than about 11%.

The invention provides for an increased energy utilization of at least 15%, 25%, 35%, or more. When calculated relative to the less than about 11% energy utilization of a putative unmodified image formed by a beam, the actual image of the invention may exhibit an energy utilization that is at least about 30% greater than the energy utilization of the putative unmodified image. For example the invention may be used to improve energy utilization of known apparatus, e.g., by at least about 30%, 100%, 200%, or more.

A number of advantages can be realized by improving intensity uniformity and/or increasing energy utilization. As an initial matter, the cost associated with low energy utilization may be reduced. In addition, improved beam utilization may result in increased thermal processing throughput, whereas improved uniformity may result in a higher quality product. Very often improved uniformity leads directly to improved utilization as well.

The better beam uniformity and improved energy utilization aspects of the invention may be achieved in a number of ways. As discussed above, some embodiments of the invention involve a method in which at least one photonic beam having a nonuniform intensity profile is used to form an image on the substrate surface, and the image is scanned across the substrate surface. A useful portion of the image has a uniform intensity profile that allows it to heat at least a portion of the substrate surface to achieve a desired uniform temperature within a predetermined dwell time. If the dwell time of the beam on a fixed point on the surface is short enough, then the depth of heating may not penetrate very far below the substrate surface. Depending on the particulars of the embodiment, reflective, refractive, diffractive, additive, subtractive, interfering, noninterfering, and/or other technologies for manipulating photonic beams may be used to produce an image with a more uniform intensity profile.

FIG. 1 is a schematic diagram of a simplified exemplary embodiment of a thermal processing apparatus 10 that may be used to anneal and/or otherwise thermally process one or more selected surface regions of a substrate according to the present invention. LTP system 10 includes a movable substrate stage 20 having an upper surface 22 that supports a semiconductor substrate 30 having an upper surface P. Substrate stage 20 is operably coupled to controller 50. Substrate stage 20 is adapted to move in the X-Y plane (as well as along the Z-axis) in a transverse and/or rotational manner under the operation of controller 50 so that the substrate can be scanned relative to the image generated from radiation provided by radiation source 110.

The radiation source 110 is operably coupled to controller 50, and an optical system 120 that serves to produce from radiation generated by the radiation source one or more beams that are in turn imaged on the substrate. In an exemplary embodiment, radiation source 110 is a $CO_2$ laser that emits radiation at a wavelength $\lambda_H \sim 10.6$ µm in the form of a beam that has a substantially Gaussian intensity profile. However, the radiation source may employ LED or laser diode radiation as well, e.g., radiation having a wavelength of about 0.8 µm. Optionally, a plurality of radiation sources may be employed. As shown, the laser 110 generates an input beam 112 that is received by an optical system 120 that is adapted to manipulate the input beam to produce an output beam that forms an image on the substrate that exhibits an intensity profile, the useful portion of which is uniform. As shown schematically, the optical system 120 includes a first reflector 122 and a second reflector 124. In practice any number of optical elements may be used some of which may be in the form of a reflector such as an aspheric mirror and/or a cylindrical mirror. Piezoelectric actuators on reflectors such as the fold mirrors can be used to stabilize the position and the pointing angle of the beam. Similarly mirrors with adjustable power can be used to change the beam size and adjustable aspheric mirrors can serve to improve the image intensity profile produced by the optical system.

The optical system may vary according to the requirements of the apparatus. For example, any one or a combination of reflective, refractive, and diffractive elements may be used. In addition or in the alternative, the input beam may be transformed into the output beam using an optical system that includes a plurality of waveguides or optical fibers, each having a receiving terminus and an emitting terminus. The waveguides or fibers may be arranged such that receiving termini thereof form a receiving array that intercepts some, most, or substantially all of the input beam and that emitting termini thereof form an emitting array having an amplitude and phase distribution required to form an image with an extended uniform section.

Through judicious mapping of the corresponding locations of the receiving and emitting termini in the emitting array, an output beam can be created that is relatively independent of the shape and position of the input beam. For example, the input and output ends of the waveguides may be arranged so that the image formed on the substrate surface has a higher proportion of energy contained in the useful portion of the image after a displacement of the beam with respect to the input end of the array than would be the case without the waveguide array. In addition, the ends may be arranged so that the image formed on the substrate surface has a higher proportion of energy contained in the useful portion of the image after a change in the size of the beam at the input end of the array than would be the case without the waveguide array. Also by careful adjustment of the phase and amplitude of the output beam, it is possible to create an image with the desired characteristics; e.g., a uniform intensity profile. Variations pertaining to optical systems that may be used with the invention are discussed in greater detail below.

In any case, the optical system 120 transforms the input beam 112 into output beam 140. Beam 140 travels along optical axis A, which makes an angle θ with a substrate surface normal $N_S$. Typically, it is not desirable to image a laser beam on a substrate at normal incidence, because any reflected light may cause instabilities when it returns to the laser cavity. Another reason for providing optical axis A at an incident angle θ other than at normal incidence, is that efficiently coupling of beam 140 into the substrate 30 may best be accomplished by judicious choice of incident angle and polarization direction, e.g., making the incident angle equal to the Brewster's angle for the substrate and using p-polarized radiation. In any case, the stage may be adapted to scan the substrate through the beam position while preserving the incident angle.

Beam 140 forms image 150 at substrate surface P. In an exemplary embodiment, image 150 is an elongate image, such as a line image, having its lengthwise boundaries indicated at 152, and located within a plane containing the incident beam axis and the surface normal. Accordingly, the incident angle of the beam (θ) relative to the substrate surface may be measured in this plane.

The controller may be programmed to provide relative movement between the stage and the beam. As a result, the image may be scanned across the substrate surface to heat at least a portion of the substrate surface. Such scanning may be carried out in a manner effective to achieve a desired temperature within a predetermined dwell time, D. Scanning may typically be performed in a direction that is orthogonal to the lengthwise axis of the image although this is not a requirement. Nonorthogonal and nonparallel scanning may be carried out as well. A means may also be included to provide feedback as to the effectiveness of the intensity uniformization technology. Various temperature measuring means and methods may be used with the invention. For example, a detector array, with each detector optionally keyed to specific location on the substrate surface might be used to measure the temperature distribution over the surface or the maximum temperature as a function of the position across the length of the beam image. Optionally, a means for measuring the intensity profile of the beam on the substrate may be used as well.

Optimally, a real-time temperature measurement system may be employed that can sense the maximum temperature with a spatial resolution smaller than thermal diffusion distance and with a time constant less than or comparable to the dwell time of the scanned beam. For example, a temperature measurement system may be used that samples the emitted radiation 20,000 times a second at 256 points spread evenly over a 20 mm line-image length. In some instances, 8, 16, 32, 64, 128, 256, 512, or more distinct temperature measurements may be made at a rate of 100, 1000, 10,000, 50,000 line scans per second. An exemplary temperature measurement system is described in U.S. patent application Ser. No. 11/129,971, entitled "Methods and Apparatus for Remote Temperature Measurement of a Specular Surface", filed on May 16, 2005. Such temperature measurement systems may be used to provide input to the controller so that appropriate corrections can be made possibly by adjusting the radiation source and/or the optical system.

Another exemplary temperature measurement system employs a linear array of InGaAs detectors, each 50 micrometers wide and 500 micrometers high, which are employed in the wavelength band from 1.5 µm to 1.7 µm. Each detector is positioned to receive p-polarized radiation emitted directly from the substrate at Brewster's angle so the substrate closely resembles a black body. Periodically, there is superimposed on the field of view of the linear detector array a radiation sample that has been collected from the opposite azimuth angle and retro-reflected from the portion of the substrate under observation. If the substrate is truly a black body, there is no reflection of this radiation and the signal remains the same. If the portion of the substrate under observation is not a perfect black body then some of the retro-reflected radiation is reflected from the wafer surface and onto the detector array to increase the signal level. The change in signal level allows the emissivity of the wafer to be calculated on a point-by-point basis and accounted for when converting the radiation measurement into a temperature estimate.

In any case, the invention may also provide modules that may be incorporated into or used to modify existing thermal processing equipment, laser-based or otherwise. The modules include, for example: temperature measurement means; active optical elements, such as deformable mirrors for altering the beam intensity profile and/or shape; mirror actuators to correct beam pointing and position errors, and means for maintaining the beam size. In some instance, use of these modules may obviate the need of selected components of existing laser thermal processing equipment, e.g., magnification relays.

Apodization Technologies

Regardless of the apparatus particulars, one or more beams having a nonuniform intensity profile may be manipulated so that when imaged on the substrate the length over which the intensity profile has acceptable uniformity is increased. Generally, apodization techniques for rendering a uniform beam image involve precise and accurate control of the shape, size, position and direction of an input beam and very precise control of the imaging optical system. It has been demonstrated that current state-of-the art diffraction optical elements may sometimes be used to achieve a flat, top-hat beam profile within 5%. The main limitation to achieving a profile better than 5% is mainly variations in the profile of the input beam and imperfections in the optical elements disposed between the radiation source and the substrate.

Aspheric Elements

In some instances, the intensity profile of the input beam may be substantially Gaussian in shape. Optionally, the intensity profile may include in addition some higher order Hermite-gaussian eigenmodes that alter the beam shape. After passing through the imaging system, the input beam is transformed into an output beam, which when imaged may have an intensity profile that is more box-car (in the context of line images) or top hat (in the context of round spot images) in shape. This may be done, for example, using various known techniques known in the art. In particular, it has been demonstrated that an input beam having an intensity profile that is substantially Gaussian in shape may be converted into an output beam image with an intensity profile that is more boxcar in shape using a mirror having an aspheric surface. In effect, such an aspheric surface expands the useful portion of the output beam. Another advantage of adding the aspheric surface is that the aspheric can be employed to assist in generating a sharp cutoff at the beam edge. As discussed below, design, construction and implementation of aspheric elements may be based on results obtained from various modeling techniques.

Generally, aspheric elements of the invention may involve a reflective or refractive surface that is "w" shaped in one cross-section and flat in the orthogonal direction. The total departure from a flat plane may be only a few microns to a hundred microns depending on the position of the element in the optical train. In some instances, it may be difficult to fabricate an aspheric element having a reflective surface that exhibits exactly the desired profile, and the desired profile may change slightly with time. However, when the desired amount of aspheric departure from the surface profile of a widely available optical element is small, e.g., ±5 micrometers, and the element is reflective it is sometimes possible to distort the element under appropriate forces so as to shape the surface such that it precisely and accurately conforms to the desired profile, at least temporarily. Adjustable apodization technologies such as deformable mirror elements are discussed below.

Beam Position and Size

Beam position and stability, particularly relative to the beam shaping optical systems described in the invention, are typically important factors that affect the quality of the processing image. In the context of thermal processing of semiconductor wafers, the beam position should be maintained to a small fraction of a percent of the beam width. Furthermore, the initial beam intensity profile should be accurately known and be maintained substantially constant as well.

For example, for laser beam position may vary over a two millimeters range at a point eight meters from the laser because of pointing instability. In addition, the nominal beam width may vary by about ±five parts in eighty. These changes may occur in a fraction of a second. There may also be temporal changes in the relative proportions of low order modes making up the beam profile, that occur slowly over weeks of time and contain as much as 5% of the energy in the beam.

Figure 2:
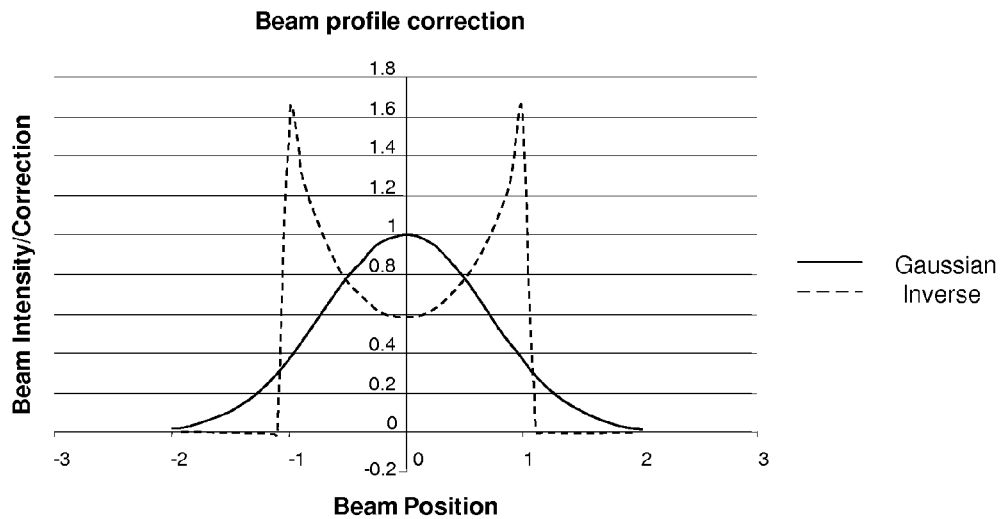
FIG. 2 is a plot that models how an input beam with a Gaussian intensity profile may be converted using an optical element having a correction function into an output beam with a substantially uniform intensity.
Figure 3:
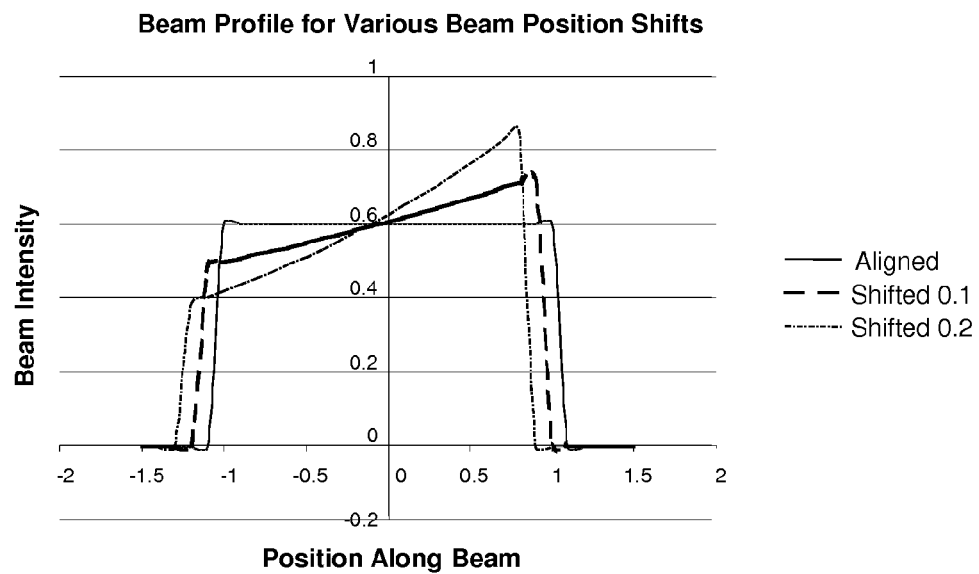
FIG. 3 is a plot that models how shifts in relative positions of the input beam and the optical element of the model associated with FIG. 2 may affect the intensity profile of the output beam.

When a Gaussian laser beam is not properly centered on the optical system that uses an aspheric element, the beam intensity profile generated as a result may be suboptimal. The deleterious effects on image generation may be approximated by assuming the aspheric element operates on the Gaussian profile in much the same way as the reciprocal Gaussian function operates on a Gaussian function when they are multiplied together. This is shown in FIG. 2. When both the Gaussian curve and its inverse function are properly aligned and multiplied together the result is a flat boxcar function shown as the aligned curve in FIG. 3. As the Gaussian input beam shifts with respect to the beam shaper, a flat tilted curve results, and the degree of tilt varies with the amount of decenter in a roughly linear fashion. In this example, a total nonuniformity of 1% is produced by a decenter of about 1/164 of the beam width measured at the 50% points.

Thus, for thermal processing technologies using beams with a Gaussian intensity distribution, the alignment between the beam and the beam forming optical system may be adjusted by measuring the tilt in the resultant temperature profile. Such a measurement provides a direct estimate of the amount the Gaussian beam is decentered on an aspheric if that is what is used to shape the image profile. Real time adjustments in the position of the beam on the aspheric may be made for rendering the beam's intensity profile more uniform. In some instances, it may be advantageous to measure the tilt in the temperature profile produced on the wafer instead of measuring the beam decenter directly. The fourth-power dependency of the emitted power as a function of temperature makes this technique four times more sensitive than measuring beam decenter or the beam profile on the substrate directly. In addition, direct measurement of substrate temperature may automatically compensate for a number of other effects such as a slow shift between the position determined by beam offset detectors and the actual center of the aspheric beam forming element.

Beam Breathing (Beam Size Changes)

As a related matter, beam-forming technologies used with the invention may also have to take into account or compensate for beam breathing. Beam breathing typically occurs when a continuous laser beam traverses a significant distance though an atmosphere. Irregularities in the temperature along the beam path through the atmosphere may create small index of refraction irregularities that cause the beam to dance about and to change shape. Some of the irregularities may also occur in the gas plasma contained with the laser cavity. The intensity profile of the beam will likely change over time as well.

Figure 4:
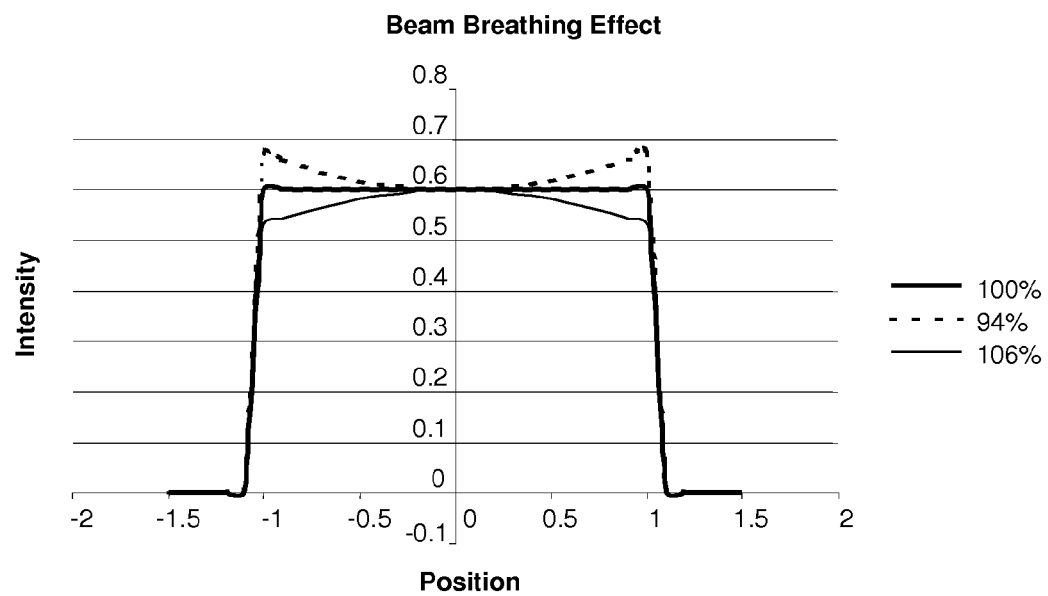
FIG. 4 is a plot that models how beam diameter changes (beam breathing) associated with the input beam of the model associated with FIG. 2 may affect the intensity profile of the output beam.

Detection of beam breathing is generally a straightforward matter, particularly for input beams with a generally Gaussian intensity profile. For example, FIG. 4 illustrates the effect of a ±6% change in beam size, which changes the uniformity by a like amount. As shown, a nominally flat topped beam profile may be rendered concave or convex at the top depending on whether the Gaussian input beam shrinks or expands with respect to its nominal size. A measurement comparing the average intensity or the temperature at two points equally spaced from the beam center with the intensity or temperature at the beam center leads to a convenient measure of any change in the beam width.

To first order, beam breathing may be corrected for by incorporating into the beam path a bendable element that adds or subtracts optical-power to the beam path thereby changing the beam size further down the path where the beam shaping optics are located. Optionally, but not necessarily preferably, the aspheric may be bent.

Apodization Modeling

Design, construction and implementation of optical modules may begin from parameters generated from ray-tracing modeling techniques known in the art.

Figure 5:
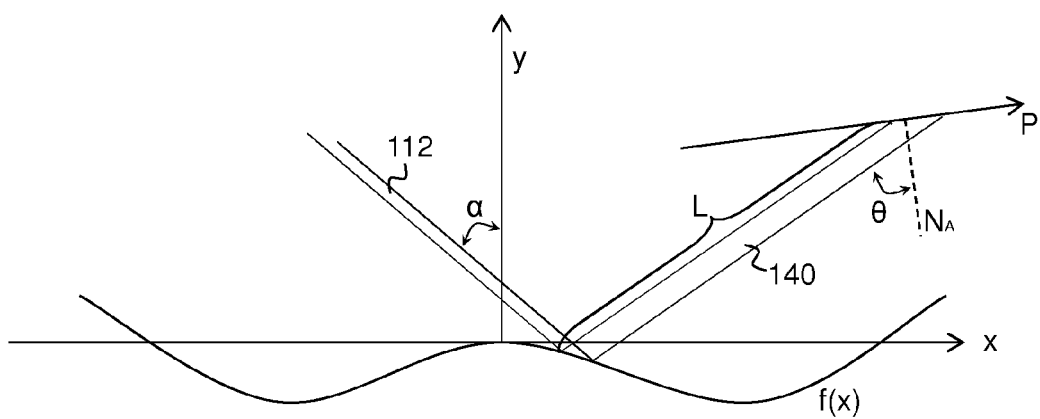
FIG. 5 schematically illustrates the geometries associated with an exemplary ray-tracing model of a reflective aspheric meant to alter the beam intensity distribution of the wafer.

FIG. 5 shows the geometries associated with an exemplary model. An aspheric reflective surface is shown having a profile that is described by a function, f(x). A beam of radiation (input beam 112) strikes the aspheric surface at angle $\alpha$ relative to aspheric surface normal $N_A$. In turn, the radiation (output beam 140) is reflected toward and strikes substrate surface, P, at angle $\theta$ relative to substrate surface normal $N_S$, thereby forming an image. The intensity profile of the image formed beam at the substrate surface $I_p(p)$ can be approximated by Eq. (1) as follows:

$$I_p(p) = I_x(x)(\Delta x/\Delta p) \qquad \text{Eq. (1)}$$

where x represents the distance from the center of the aspheric surface, $I_x(x)$ is the intensity profile of an image formed at the aspheric surface, p represents the distance from the center of the image formed on the substrate, and $\Delta x$ and $\Delta p$ are the relative sizes of the beams on the aspheric and substrate surfaces, respectively, which are related as follows:

$$\Delta p = \Delta x (1 - (2L/\cos \alpha)(d^2 f(x)/dx^2)) \cos \alpha / \cos \theta \qquad \text{Eq. (2)}$$

where L is the distance between the aspheric surface to the substrate surface and is assumed not to vary. The combination of Eqs. (1) and (2) yields Eq. (3), as follows:

$$d^2 f(x)/dx^2 = (\cos \alpha - (I_x(x)/I_p(p)) \cos \theta)/2L \qquad \text{Eq. (3)}$$

Experiment has shown that when the aspheric is replaced with a flat fold mirror, that the laser power has to be reduced considerably. Otherwise the intensity in the beam center will be too high. This can be corrected if the center of the aspheric is made sufficiently convex that the power on the substrate is reduced by a factor of 1.4. Thus: When x=0:

$$I_x(0)/\cos \alpha = 1.4 \, I_p(0)/\cos \theta \qquad \text{Eq. (4)}$$

Since it is desirable that $I_p$ be constant, $I_p(0)=I_p(p)=K$. Thus:

$$I_p(p)=(I_x(0)\cos\theta)/(1.4\cos\alpha)=K \qquad \text{Eq. (5)}$$

$$d^2f(x)/dx^2=(\cos\alpha-1.4I_x(x)\cos\alpha/I_x(0))/2L \qquad \text{Eq. (6)}$$

and $$p=(x\cos\alpha-2L(df(x)/dx))/\cos\theta \qquad \text{Eq. (7)}$$

By using appropriate values for L, $\alpha$ and $\theta$, the equations set forth above may be used to model intensity profiles at substrate surfaces. For example, a typical LTP system may be modeled assuming L=509.32, $\alpha$=37.5° and $\theta$=75°.

Figure 6:
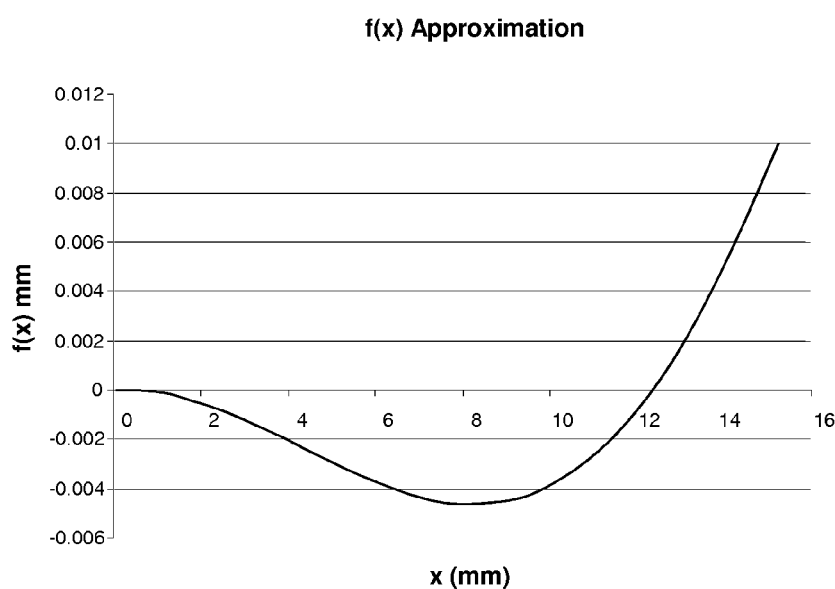
FIG. 6 is a plot generated from of ray-tracing based model that approximates an ideal aspheric surface that may be used with the invention.

In a simple model, an input beam having a Gaussian intensity distribution is assumed. The representative plots of this model are shown in FIGS. 6-10. FIG. 6 provides a plot of the aspheric profile that transforms a Gaussian profile into a flat profile at the substrate. This aspheric curve may be approximated by following equation:

$$f(x)=-(1.5572\times10^{-4})x^2+(1.5781\times101x^4-(5.2366\times10^{-9})x^6+(1.2854\times10^{-11})x^8-(1.6\times10^{-14})x^{10} \qquad \text{Eq. (8)}$$

Equation (8) is a five-term polynomial ($x^2$, $x^4$, $x^6$, $x^8$, and $x^{10}$) approximation of a surface of an ideal aspheric element suitable for use with the invention when a beam having a Gaussian profile is employed. In this case, f(x) represents an approximation to the ideal surface profile. The approximation is reasonably accurate for values of x below 10. The profile is assumed to be symmetrical about x+0 so only half is shown in FIG. 6.

The aspheric profile starts out at its center with a negative curvature to reduce the intensity on the wafer at the center of the beam by a factor of about 1.4 in addition to the reduction that occurs due to the large incidence angle on the substrate. An aspheric element with such a profile may be used instead of a reduction optical relay (e.g., a 1.37× relay). As the distance from the center increases, the aspheric profile curvature changes from negative to positive in order to concentrate the diminishing energy in the wings of the Gaussian intensity profile of the incident beam. As a result, the image formed on the wafer is rendered uniform in intensity.

Figure 7:
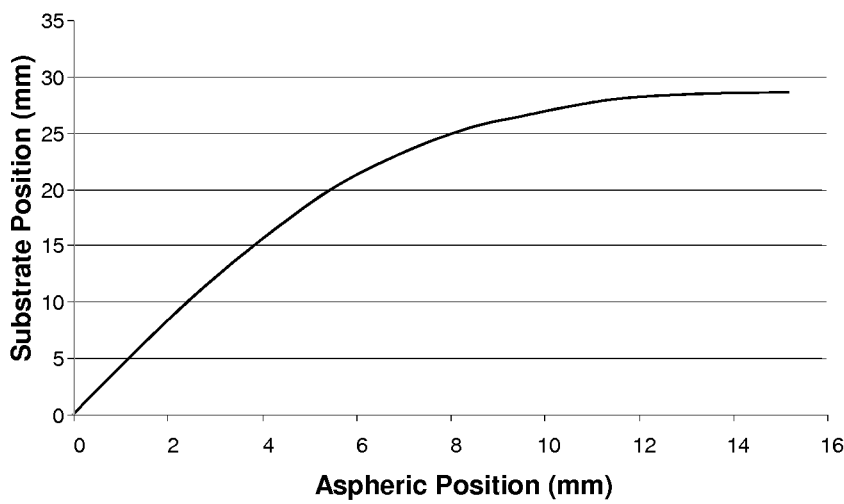
FIG. 7 is a plot that shows an idealized relationship between the ray position on the substrate versus its position on the aspheric surface of the model associated with FIG. 6

FIG. 7 shows a plot of an idealized relationship between the ray position on the substrate versus its position on the aspheric element described above. The ray position on the wafer becomes asymptotic with aspheric positions beyond 12 mm. Thus, ray tracing with an ideal aspheric element predicts a perfect boxcar profile on the wafer extending about 28 mm either side of the center. In practice the profile at the ends of the boxcar may be limited by diffraction, which is not easily modeled using geometrical ray tracing techniques. Accordingly, the useful length of the image generated by the beam would be closer to ±25 mm.

Figure 8:
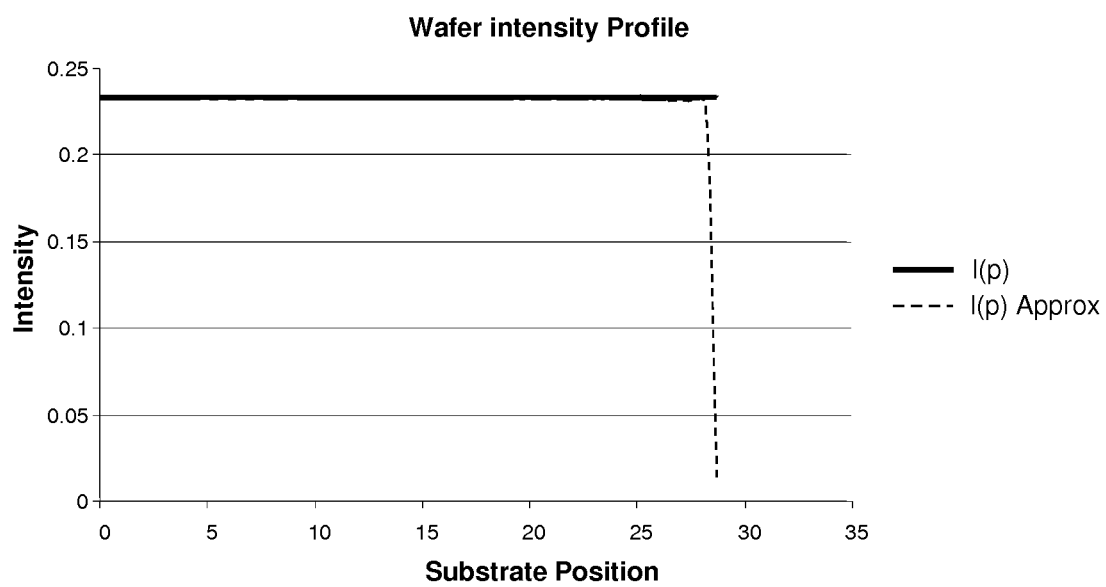
FIG. 8 is a plot that shows the intensity profile of an image formed on the substrate from a Gaussian beam reflected from the aspheric element of the model associated with FIG. 6 with and without some edge modifications.
Figure 9:
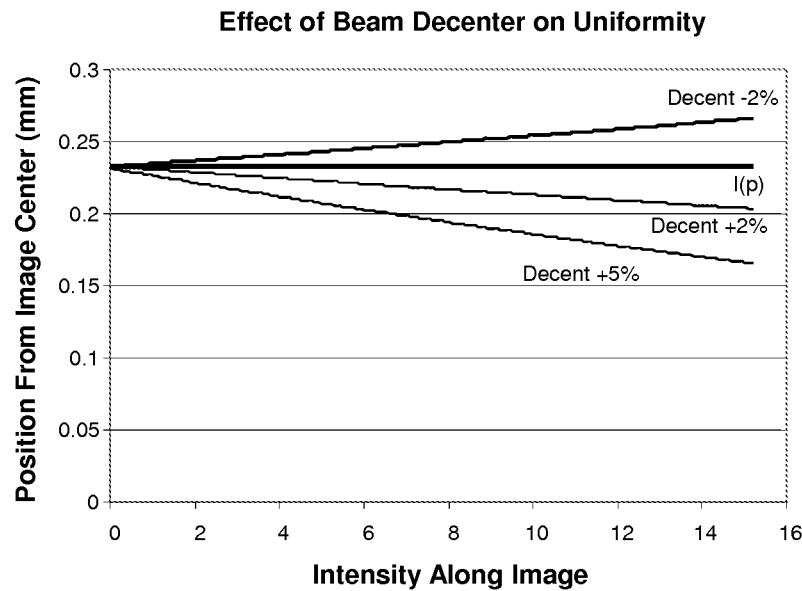
FIG. 9 is a plot that shows the effects of beam decentering on the intensity uniformity of the output beam of the model associated with FIG. 6.

If the aspheric followed the five-term approximation in Eq. (8), which departs slightly from the ideal curve beyond about 11 mm, then the resultant wafer intensity profile is as shown in FIG. 8. Thus the aspheric profile also assists in generating a sharp cutoff at the beam edge. The beam profile drops from 99% to 35% in going from 27.96 mm to 28.519 mm on the wafer surface with this ray tracing model FIG. 9 provides the results from a ray trace model that examined the effects of beam decentering relative to the aspheric on the intensity profile of an image. When a beam has a nominal width of 12.6 mm measured between the 50% points on the aspheric element, a 2% decentering corresponds to a lateral decentration of 0.2521 mm. This much decenter results in a ±14% uniformity error at the edge of the image. Thus, the tolerance for decentration, assuming a 1% peak-to-peak maximum allowable non-uniformity, is about ±0.009 micrometers. Also shown on FIG. 9 is the beam profile as a result of a 5% decentration, which corresponds to roughly 5/2 the result of a 2% decentration. Thus, as discussed above, nonuniformity varies linearly with decentration, and measuring the degree of tilt in the temperature profile leads to a direct estimate of the amount the Gaussian beam is decentered on the aspheric element.

Figure 10:
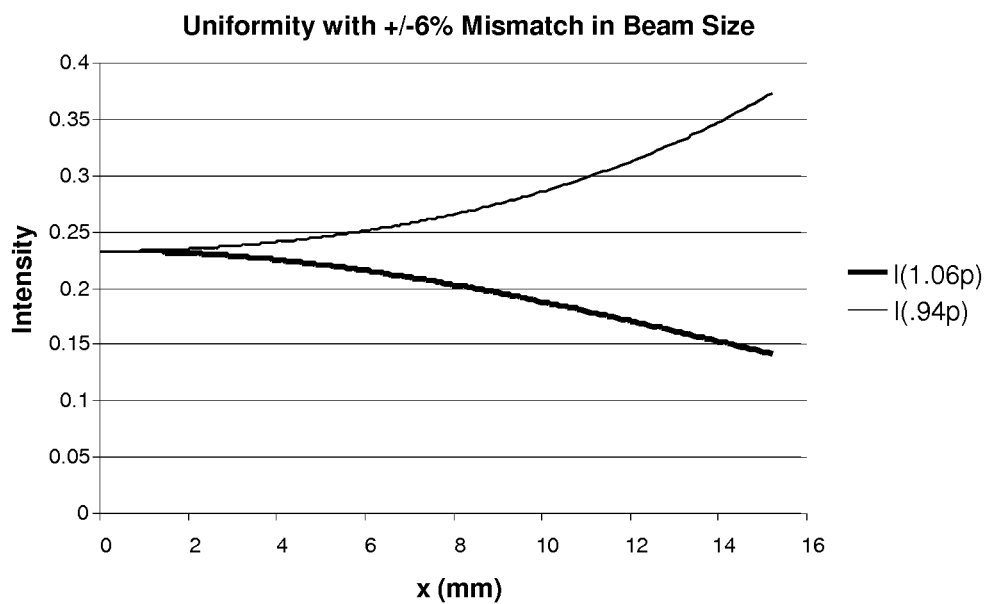
FIG. 10 is a plot that shows the effects of beam size variations on the intensity uniformity of the output beam.

Ray trace modeling techniques may also be used to provide a fairly accurate prediction of the effect of beam size changes on uniformity. As shown in FIG. 10, a ±6% change in the beam width may result in a concave or a convex beam profile that departs from ideal by ±13% at the edge of the beam (x=8 mm).

The ray trace equations discussed above, allow the aspheric surface f(x) to be determined from the intensity profile of the input beam and the desired intensity profile of the output beam. As discussed above, the laser beam may be assumed to follow a Gaussian profile. However it has been observed that some high power $CO_2$ lasers generate beams having intensity profiles that may be better approximated with a Gaussian-Hermitian curve rather than a purely Gaussian curve. In addition, the intensity profile of such a beam may vary over time and with the distance between the laser and the measurement point. Thus, in a more comprehensive analysis, input beams having non-Gaussian intensity profiles would have to be accommodated.

Figure 11:
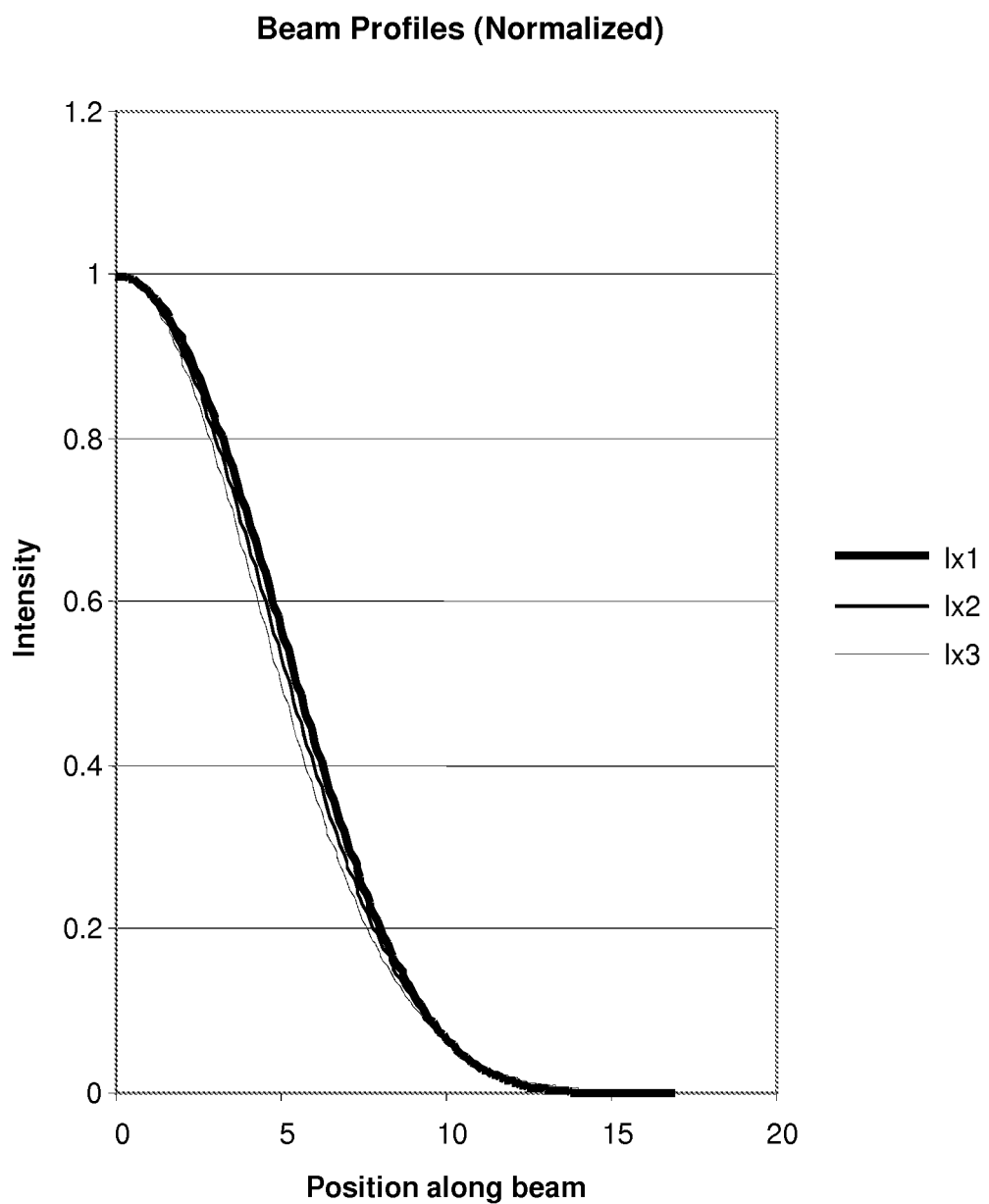
FIG. 11 is a normalized plot of the intensity profiles of three input beams having different intensity profiles.
Figure 12:
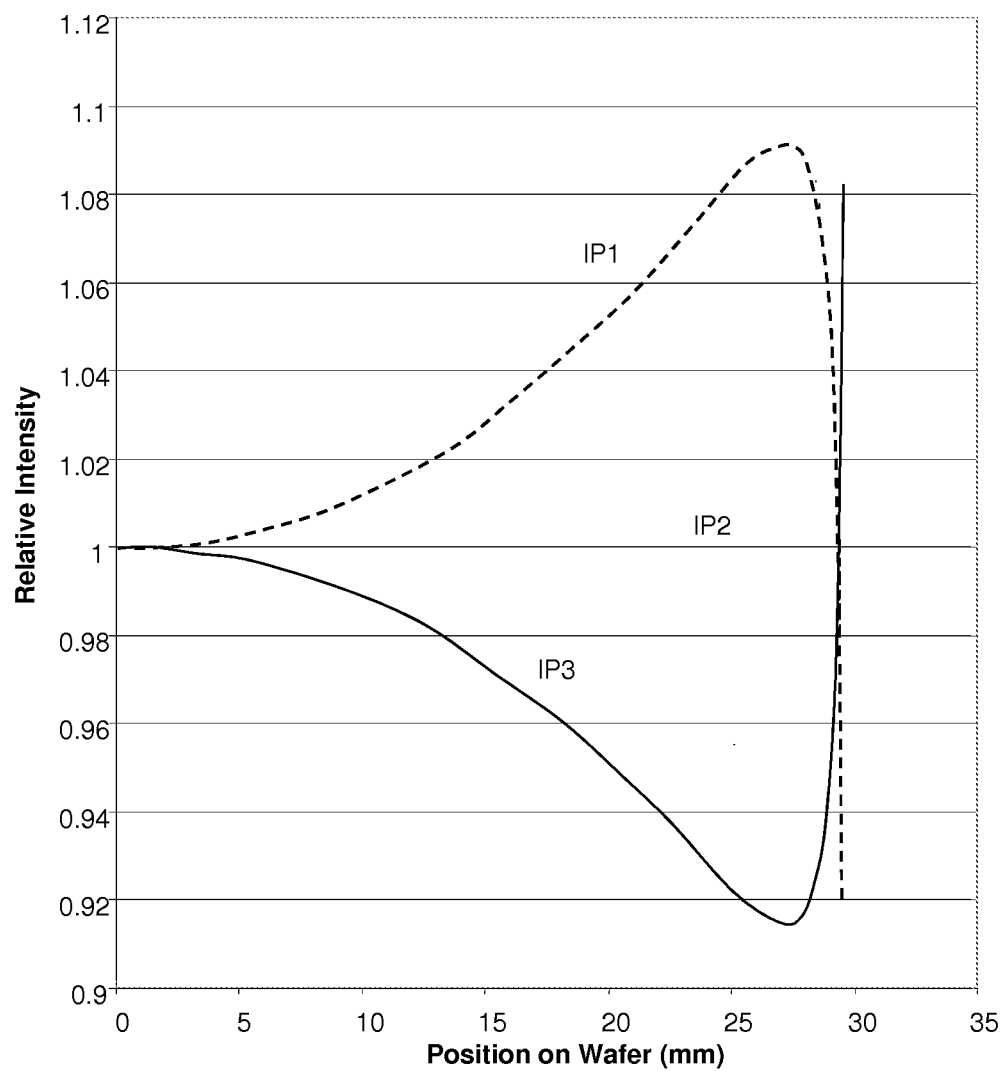
FIG. 12 is a plot of the intensity profiles of the output beams formed from three input beams of FIG. 11 as a result of reflection from an aspheric surface.

FIG. 11 provides a normalized plot of three different beam intensity profiles, $I_{x1}$, $I_{x2}$, and $I_{x3}$ that represent the range of laser beam profiles that are likely to be encountered on one commercially available laser. $I_{x1}$ is the intensity profile of a perfectly Gaussian beam (Beam 1) and $I_{x2}$ and $I_{x3}$ are the intensity profiles of laser beams having different amounts of fourth order Gaussian-Hermitian contribution. These three intensity profiles have been used in the ray trace model to examine the effects of beam profile changes on the beam image uniformity after reflection from an aspheric element. FIG. 12 provides a plot of the intensity profiles of the output beams produced as a result of reflection from an aspheric surface designed to render intensity profile $I_{x2}$ uniform. As expected, the intensity profile of the output beam generated from Beam 2, $I_{P2}$, is rendered uniform. Notably the intensity the output beams generated from Beam 1 and Beam 3, $I_{PS}$ and $I_{p3}$, respectively, deviate increasingly with distance from the intensity at the image center. As shown, $I_{P1}$ and $I_{P3}$ deviate from $I_{P2}$ by nearly 10% at about 23 mm from the image center on the wafer. Thus small changes in the input beam profiles lead to large changes in the beam profiles on the wafer.

Figure 13:
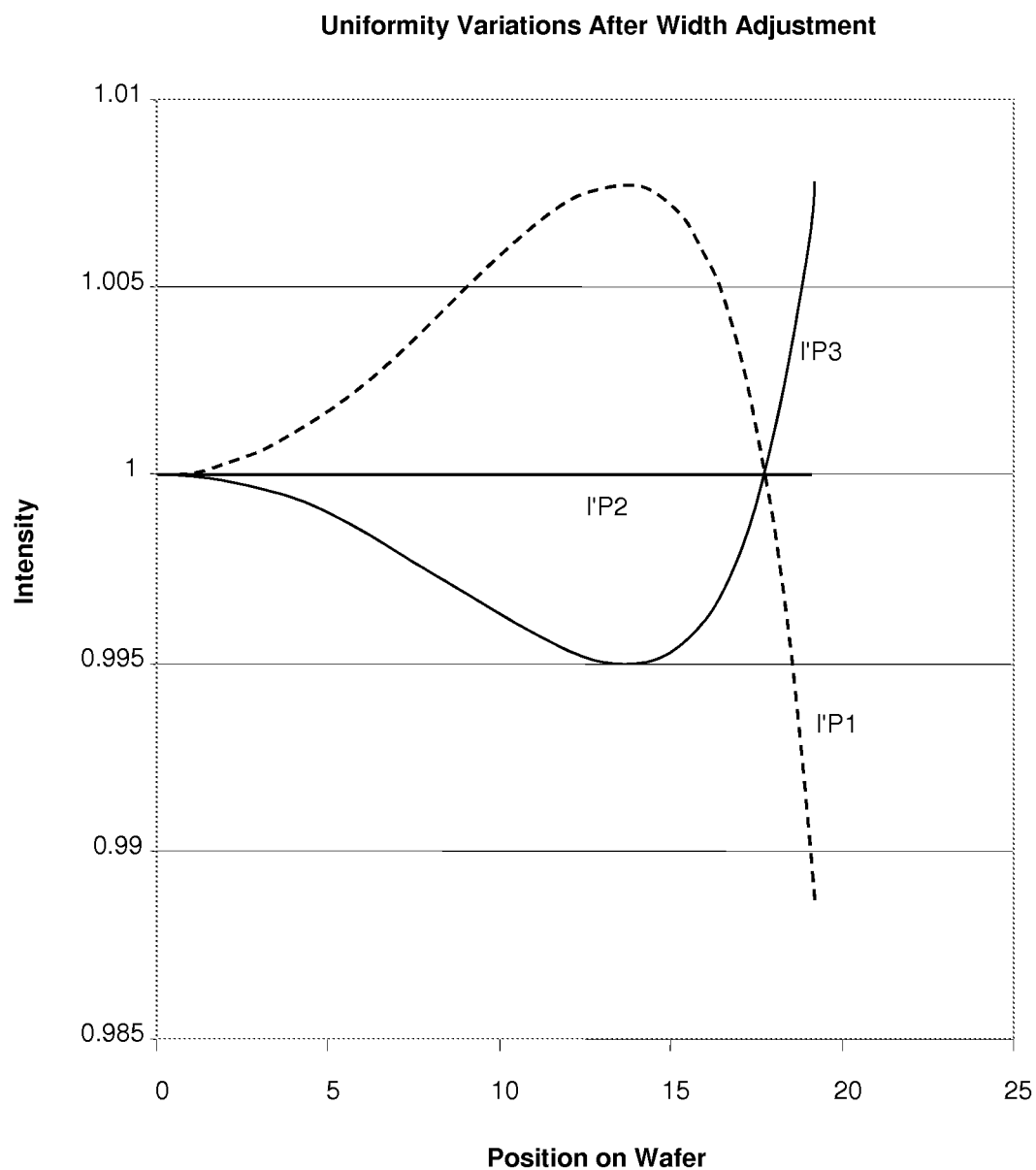
FIG. 13 is a plot of the intensity profiles of the output beams formed from three beams with differing profiles after adjustments to their width and after reflection from an aspheric surface.

It has been noted that beam profile changes produce a similar effect to beam width changes and therefore the beam width may be adjusted to compensate for changes in the beam profile. FIG. 13 illustrates the efficacy of this approach. What was a 9% uniformity issue has been reduced to less than 1%, however in one case the intensity is headed up where irreparable damage would likely be done to the substrate. Thus, in order to employ to employ width adjustment to compensate for profile changes, it may be necessary to find some means of attenuating the edges of the beam profile.

There are a number of ways in which this problem may be addressed. For example, radiation from the periphery of the beam may be prevented from reaching the wafer by a baffle and a relay. This solution is far more difficult than it appears, because of the image artifacts generated in a fully coherent imaging system. Another way to address this problem is to modify the aspheric profile f(x).

Figure 14:
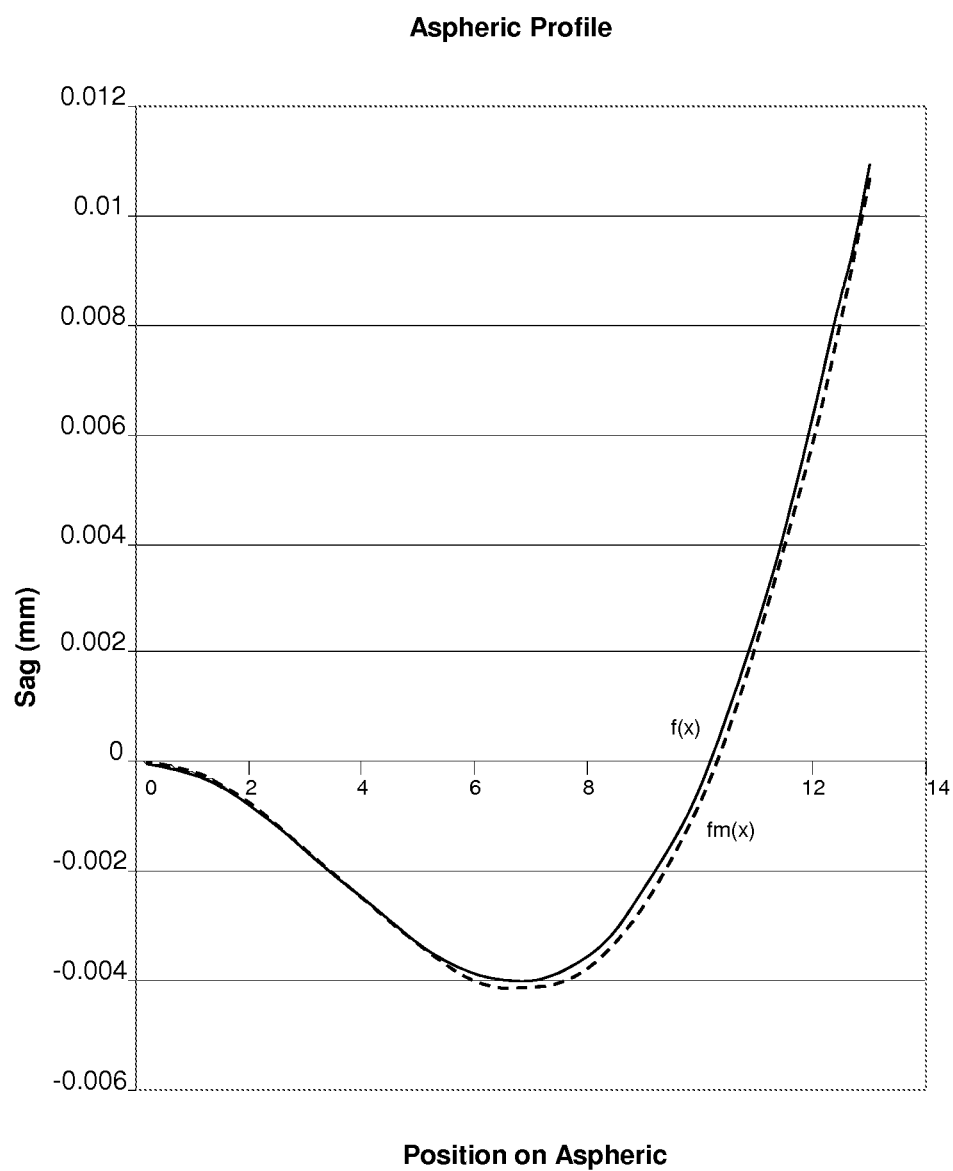
FIG. 14 is a plot of two aspheric surface profiles, one unmodified and the other unmodified.
Figure 15:
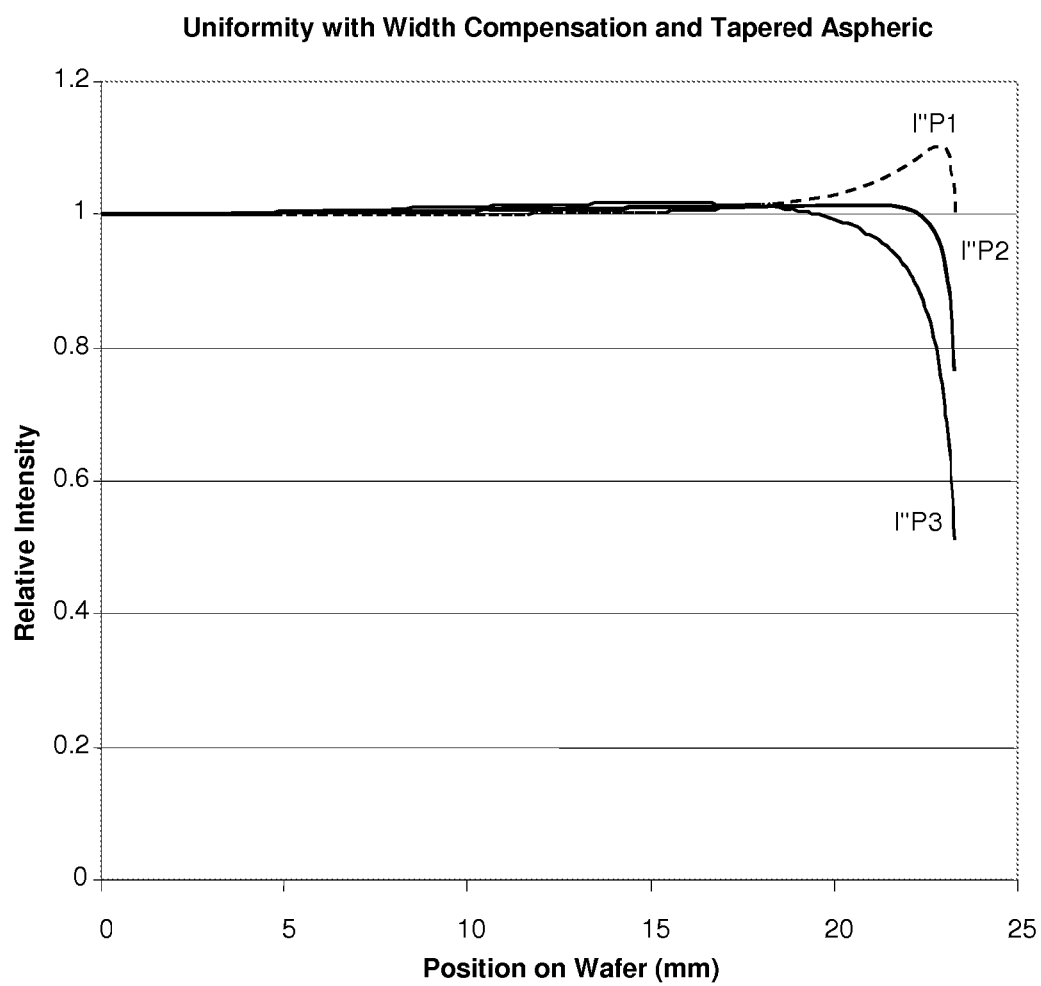
FIG. 15 is a plot of the intensity profiles of output beams formed from three adjusted input beams as a result of reflection from a modified aspheric surface.

FIG. 14 shows a plot of the aspheric surface profile f(x) as described above and a plot of a modified aspheric surface profile $f_m(x)$ that may be used to provide an improved roll-off in the edge profile of the wafer image. FIG. 15 shows the wafer image intensity profiles corresponding to the 3 beam profiles shown in FIG. 11 as a result of reflection from the modified aspheric surface and with size compensation. For all three cases the intensity profiles of the output beams, i.e., $I''_{P1}$, $I''_{P2}$, and $I''_{P3}$, are substantially uniform to about 18 mm from center. In addition, none of the intensity profiles show the sharp intensity increase described above that would lead to irreparable damage of some of the structures on the substrate.

Adjustable Apodization

The ray trace model results show that small changes in input beam profile or in the aspheric profile can result in large changes in illumination uniformity. Thus, as a general rule, it may be more desirable to employ adjustable optical elements with response times fast enough to make the best of whatever wavefront profile is encountered, rather than a fixed aspheric profile predicated on a perfectly known beam profile. For example, active optics may be used as well as optical elements that include some more limited adjustment capability. The active or adjustable optical element may have a reflective surface that, for example, may be initially flat and adjustable to a cylindrical or aspheric profile. In the case where a surface starts out aspheric in its neutral form, the adjusting mechanisms may be used as a means to perfect the figure to account for minor deviations from system to system or from time to time. If the surface starts out flat, then the adjustments could go so far as to provide the aspherization necessary to transform a Gaussian curve into a boxcar shape.

In any case, any of a number of adjusting techniques and mechanisms may be used to alter how the beam forming means interacts with the beam. For example, an aspheric element may be bent slightly to lengthen or shorten the image length. When appropriately coordinated with measurements of the annealing temperature, this adjustment could be used to compensate for slow changes in the radiation source intensity or beam breathing. In some instances, such adjustments may be automated and given a closed loop servo response rate approaching 100 Hz—a bandwidth sufficient to correct for the atmospheric transmission contribution to beam breathing that may be encountered during the practice of the invention. As another example of an adjusting technique suitable for use with the invention, changes in beam width due to transmission through a long atmospheric path may be corrected by adding a little cylindrical power to a nominally flat surface placed in the path of the beam before the beam reaches a beam shaping element, e.g., upstream of the beam shaping element. Other beam forming means and techniques may be discovered upon routine experimentation.

Figure 16:
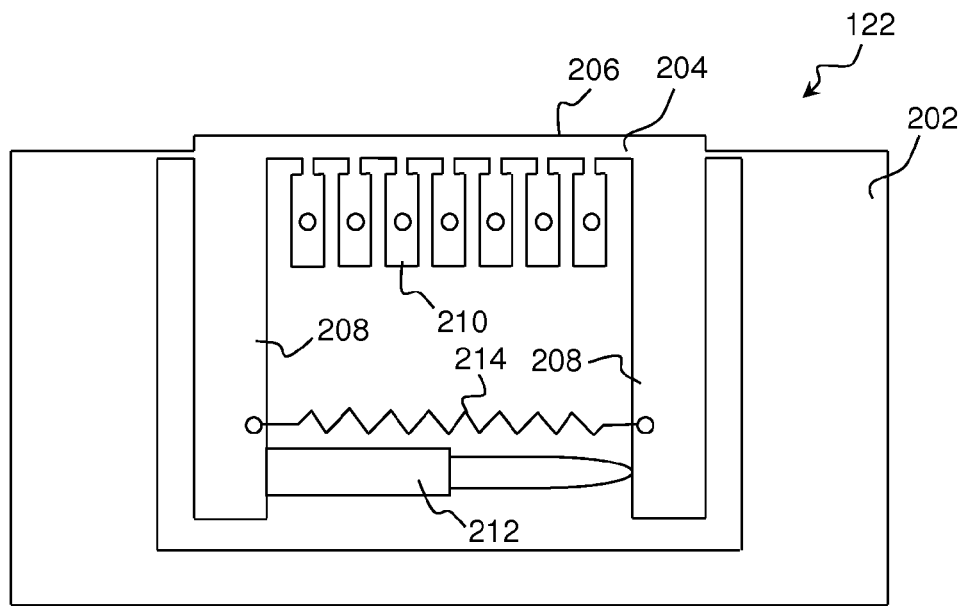
FIG. 16 schematically illustrates an optical element in the form of a power adjusting mirror that may be used to change a beam's diameter.

FIG. 16 shows in cross-sectional view an optical element in the form of a power-adjusting mirror 122 that may be used to introduce variable amounts of cylindrical power into the beam to change the size of the beam along one axis. The power-adjusting mirror 122 includes a frame 202 holding a reflecting member 204 that includes a bendable optical surface 206 (perpendicular to the plane of the paper on which FIG. 16 is printed) and bending levers 208, a plurality of water-cooled stiffeners 210, a spring 214, and an actuator 212. The reflecting member 204 may be made of from any of a number of materials, including, for example, copper, aluminum or molybdenum. When actuator 214 is a piezoelectric device or device with similar performance capabilities, the actuator 214 in combination with the spring may elastically deform the optical surface 206 in a manner that easily yields a closed loop servo response rate approaching 100 Hz. Such a response rate represents a bandwidth sufficient to correct for atmospheric generated perturbations. Beam breathing may also change the beam width in the scan direction, and thereby alter the maximum temperature produced on the substrate. Such changes can be automatically corrected by changing the laser power to achieve the desired maximum wafer temperature.

Figure 17:
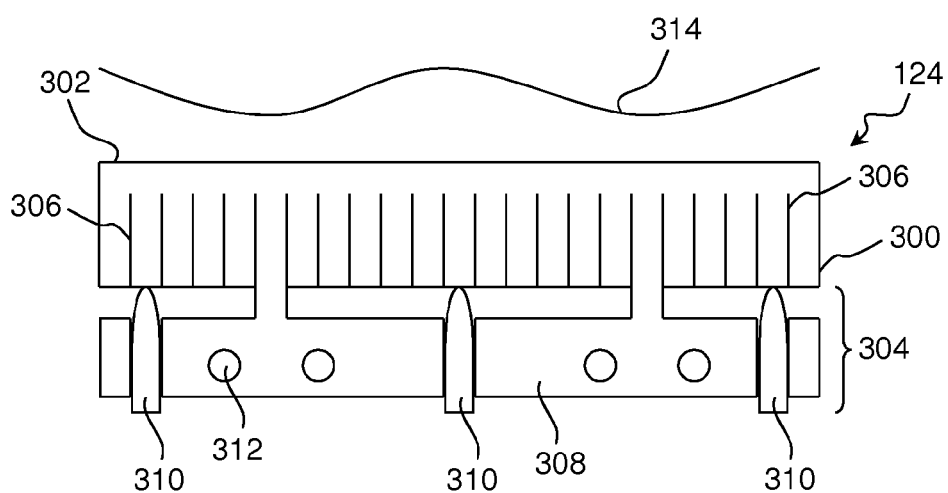
FIG. 17 schematically illustrates an optical element in the form of an adjustable aspheric mirror.

FIG. 17 shows another exemplary optical element in the form of a deformable mirror 124 having a flexible member 300 with a reflective surface 302 (and a means for adjusting the surface 304. As shown, the mirror 300 has a nominally planar top reflective surface 302 that can be adjusted to take on a cylindrical aspheric shape; i.e. aspheric in one plane only. The top surface 302 is rendered flexible in one plane by a series of cuts 306. While any appropriate means may be used to adjust the reflective surface 302, FIG. 17 shows an adjusting means 304 that includes a stiff base 308 having a plurality of adjustment screws 310 and four cooling channels 312. The profile of the deformable mirror surface 302 may be adjusted to a desired shape 314 by using the three adjustment screws 310. The aspheric mirror 124 is attached to the block 308 at two points chosen according to the size of the incident beam size and the desired wafer focal plane intensity.

Figure 18:
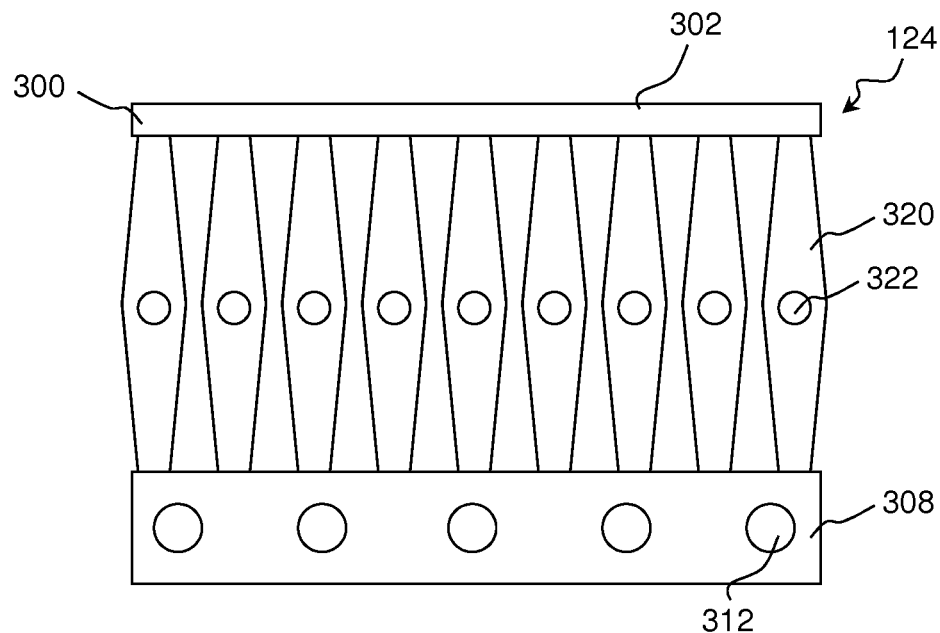
FIG. 18 schematically illustrates another optical element having an adjustably deformable surface.

FIG. 18 shows yet another exemplary optical element having a surface that may be deformed into a desired surface profile to render a beam intensity profile more uniform. The element 124 includes a flexible mirror 300 having a top optical, reflective, surface 302. The reflective surface 302, as shown in FIG. 18, is in its neutral, undistorted state and is generally planar. The mirror element also includes a plurality of longitudinal support elements 320 coupling the flexible reflective member 300 to a stiff, liquid-cooled base 308. Each support element contains a heating element 322. The stiff base block 308 may be optionally liquid-cooled though cooling channels 312. The heating elements 322 in each longitudinal support element are separately controlled. In response to the heat from the heating elements 322, and the heat load on the mirror surface 302 from the incident laser beam, each of the support elements 320 will reach a different equilibrium temperature and will expand or contract to deform the optical surface 302. By varying the heat generated in each longitudinal member it is possible to generate an arbitrary profile on mirror surface 302.

The response rate of the adjustable deformable mirror illustrated in FIG. 18 depends on its scale. Assuming that the support elements 320 are about 50 mm long and are made from copper with a thermal diffusivity of 1.136 $cm^2/s$, the time constant for approaching equilibrium after a change in one of the heating elements is estimated to be about 5.5 seconds. The average temperature difference needed to generate a 5 micrometer profile is given by $0.005/(50 \times 16.5 \times 10^{-6})=6°$ C. If the profile of the adjustable aspheric were adjusted to exactly equal the ideal profile at 9 equally spaced points, it seems likely that any residual errors would be small, perhaps small enough to result in a beam intensity profile uniformity of about 1%.

As discussed above, there is a need in the art to provide a beam having an intensity profile with a useful portion that is uniform to about 1%. However, very small errors in the aspheric profile will result in significant uniformity errors. Thus, a plurality of means may be used to provide gross and fine control over the beam forming process to produce a useful beam intensity profile that exhibits high uniformity, in some cases exceeding 1% uniformity. In some instances, additional correction means may include additional beam sources, e.g., a laser diode array, as discussed below.

Beam-Combining Technologies

The invention may also employ a plurality of beams in combination. For example, two or more independent lasers may be used to generate a plurality of beams that may be combined in such a manner to produce a single contiguous image, e.g., a line image, on a wafer surface to effect thermal processing. The beams may have the same or different intensities and/or intensity profiles. In addition, the beams may or may not have the same wavelengths. In some instances, laser diodes or light-emitting diodes may be used.

When two or more beams, each having a Gaussian intensity profile, are combined to form a single image, it is possible to significantly increase the energy utilization of the beams, often synergistically, without reshaping or otherwise modifying any of the beams. For example, energy utilization of an image created from a single beam having a Gaussian intensity profile in the context of thermal semiconductor processing is typically about 11%. When two Gaussian laser beams are combined to generate a single image, energy utilization of the beams may increase to about 36%. Additional beams may result in still higher energy utilization. The useful portion of the combined image is typically longer and/or larger than any useful portions of images of the beams by themselves. This model assumes that the beams may be added incoherently. Accordingly, the beams may have to be derived from different lasers and some precautions may be needed to assure that their frequencies do not coincide in a manner that produces coherent interference effects that compromise the image quality for thermal processing applications described herein.

Figure 19:
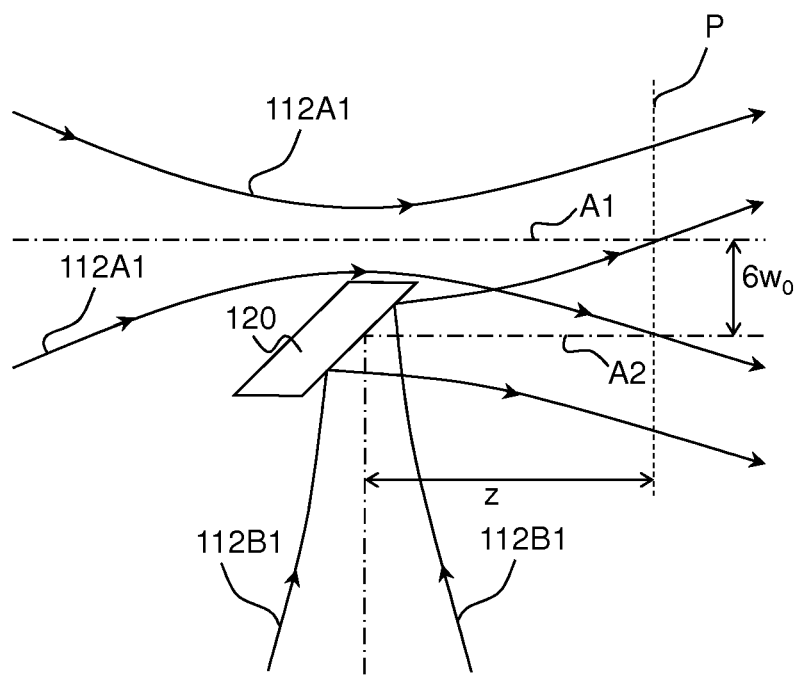
FIG. 19 schematically shows an exemplary optical system for combining two laser beams in accordance with the invention.

For the shallow junction annealing application, it is desirable to form a line image that is uniform to 1% over an extended length. FIG. 19 shows a two-beam system that may be used to produce such an image from beams each having a Gaussian profile. As shown in FIG. 19, a first beam, as represented by rays 112A1, generally follows path A1, and a second beam, as represented by rays 112B1 generally follows path A2. Unlike path A1, path A2 is bent by optical element 120. Assuming each beam has a Gaussian intensity profile, then to avoid diffraction effects from optical element 120, the beams may be separated by at least six times the $1/e^2$ radius (6 $\omega_o$), rendered colinear, and brought to the substrate P at the right point in their paths as the beams merge together. Such a beam separation/combination geometry is not an absolute requirement, but generally it proves convenient to combine the beams near their waist to satisfy the $6\omega_0$ beam separation requirement.

The resulting intensity profile for either of the dual beams shown in FIG. 19 can be modeled as follows:

$$I(r)=(2P/\pi\omega^2)\exp(-2r^2/\omega^2) \quad \text{Eq. (9)}$$

where P is the total power in the beam, co is the beam width or radius measured at some point along its extent at the $1/e^2$ intensity point, and r is an arbitrary radius measured from the center of the beam.

In order for the two beams, when added incoherently, to produce a nominally flat profile it is necessary that, at the midpoint between the two beams, the intensity of each is 0.6 of the maximum intensity of each beam. As a result, it is implied that in the case of two beams that are separated by 6 $\omega_o$ the condition for a uniform combination is given by:

$$I(r)=0.6=\exp(-2(3\omega_0)^2/\omega^2 \quad \text{Eq. (10)}$$

where $\omega_o$ is the width of the beams at their waist. Solving Eq. (10) for $\omega$ in terms of $\omega_0$, it can be seen that:

$$\omega=5.936\omega_0. \quad \text{Eq. (11)}$$

Thus, when the beams have overlapped and diverged to 5.936 times their minimum size, they will provide a uniform result.

When the uniform part beam is incident on the wafer at 75°, it is desired that the uniform part of the image stretch over a length of about 10 mm. This uniform area is equal to 0.8 $\omega$. Thus:

$$0.8\omega=10 \text{ mm}(\cos 75°) \quad \text{Eq. (12)}$$

$$\omega=3.235 \text{ mm.} \quad \text{Eq. (13)}$$

The separation between the two beams is $6\omega_0$, which translates to 3.27 mm. The distance along the beam axis z where the overlap between the expanding beams is optimum can be determined from the following relationships:

$$\omega(Z)=\omega_0(1+(z/z_R)^2)^{0.5} \quad \text{Eq. (14)}$$

$$Z_R=\pi\omega_0^2/\lambda \quad \text{Eq. (15)}$$

where z is the axial distance along the beam measured from the position of the waist and $\lambda$ is the wavelength of the laser beams. Using a wavelength of 10.6 micrometers and Eqs. (14) and (15) leads to:

$$Z_R=88 \text{ mm} \quad \text{Eq. (16)}$$

and $$Z=515 \text{ mm.} \quad \text{Eq. (17)}$$

Figure 20:
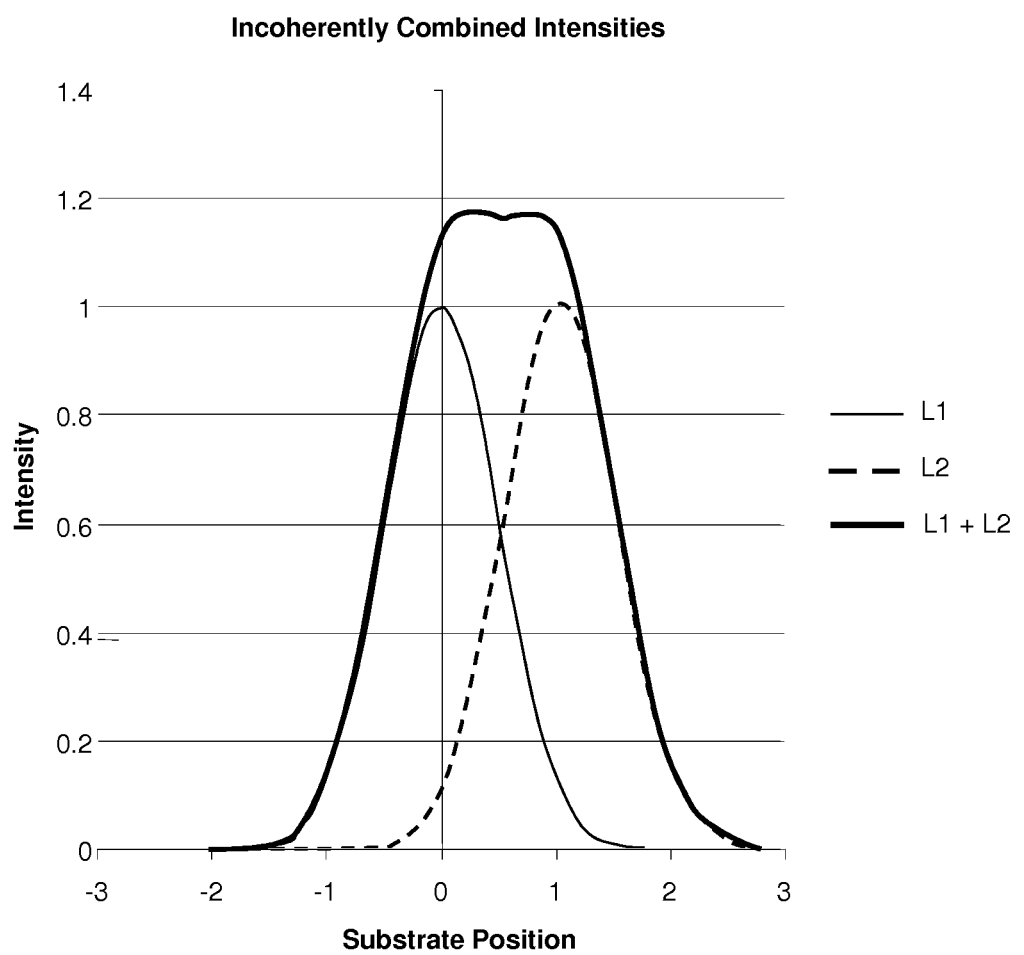
FIG. 20 is a plot of the intensity profiles of two individual Gaussian beams and their combined intensity profile.

FIG. 20 shows a schematic representation of the intensity profile of the two beams near the optimum separation and the combined intensity. FIG. 20 does not take into account the tilted focal plane which intercepts one beam before the other making it desirable to adjust the relative intensities slightly. More than two beams may be used as well.

It is also possible to combine beams of widely different intensities and wavelengths to achieve a uniform annealing temperature profile. For example, a high-power laser beam that forms an image having a substantially Gaussian intensity profile on a substrate may be used in combination with beams from a plurality of lower-power beams from LEDs or laser diodes. As discussed above, for any beam with a Gaussian intensity profile, effectively only the central portion of the beam with the highest intensity can serve as a useful portion for thermal processing. The energy associated with the useful central portion is about 11% of the total beam energy, and the energy associated with the rest of the beam, i.e., about 89% of the total beam energy, is effectively wasted. Here, the lower-power beams may serve to add additional power to the lower intensity portions of the high-power beam. As a result, a greater portion of the substrate illuminated by the image may be heated to substantially the same peak temperature. In effect, the energy from the periphery of the high-power laser beam may be combined with the energy from the lower-power beams instead of being effectively wasted.

Interference Issues

Interference issues sometimes represent a significant hurdle in the implementation of beam combining and beam shaping technologies. In general, coherent interference effects should either be avoided or minimized. For example, when two laser beams are combined to generate a single image, interference will arise between the two beams when their wavelengths are nearly equal. Such interference is particularly detrimental if it occurs for a period of time comparable to the dwell time of the laser beam over a point on the substrate, e.g., about one millisecond. Thus, one way in which adverse interference effects may be addressed is to "lock" the two wavelengths in such a way that a small difference always separates them. Nevertheless, the wavelengths of laser generated beams are generally determined by a number of different parameters. For example, a laser's wavelength may be affected by, the state of laser's gain medium (e.g., the laser gas pressure and/or pressure if the medium is a gas), the laser's construction (e.g., the geometry of its cavity), and etc. Left alone, a laser beam's wavelength will tend to drift in time as the gain medium temperature, pressure and cavity dimensions vary.

Thus, when two laser beams are employed, it is unlikely that the two beams will exhibit the exact same frequency and interfere with each other at any single point in time. However, there is a finite probability that, at some point in time, the beams will exhibit the same frequency, and when they do, they will generate interference pattern fringes with nearly 100% modulation. As discussed above, such interference is particularly detrimental if it occurs for a period of time comparable to the dwell time of the laser beam.

The detrimental effects of such interference phenomenon may be mitigated if interference were to occur in a sufficiently short time period compared to the dwell time. For example, if the transitory period for significant interference effects is one tenth or less than the dwell time, then the net result on the peak temperature, which depends on the intensity integrated over the whole dwell time period, is likely to be negligible. Accordingly, another way in which adverse interference effects may be mitigated is to vary at least one laser wavelength, e.g., in a sinusoidal, saw-tooth, or other oscillating manner, with respect to the other at a sufficiently high rate such that any coincidence or coincidences in wavelength will be short compared to the dwell time.

For example, when two or more lasers are used, the cavity length of the one or more lasers may be periodically varied so that the time span where the wavelengths from separate lasers is likely to be close enough to generate interference effects will be short compared to the dwell time. Optionally, one of the laser beams in the group of lasers being combined may have a wavelength that is not varied.

As discussed above, the exact wavelength and therefore the frequency at which a laser operates depends on a number of parameters, one of which is the length of the cavity. Within the gain curve, lasers can operate at frequencies (F) that are multiples of $c/(2L)$;

$$F = nc/2L = c/\lambda \qquad \text{Eq. (18)}$$

where c is the speed of light ($3 \times 10^8$ m/sec), L is the length of the cavity containing the gain medium, n is an integer (usually a very large integer), and λ is the wavelength.

For a one-meter long cavity, the laser frequency is an integer multiple (n) of c/2L or 150 MHZ. These are called the longitudinal modes of the laser. For example, for a laser operating at 10.6 micrometers, the center frequency is approximately $2.8 \times 10^{13}$ Hz, or $2.8 \times 10^7$ MHZ. If the laser can operate at any integer multiple of c/(2L), and L is equal to 1 meter, then the multiple (n) is 188,679. The exact laser frequency for this example is $2.830185 \times 10^{13}$ Hz. The bandwidth of a longitudinal mode is determined by several factors, including the cavity geometry, the gas pressure and reflectivity of the mirrors. Typical bandwidths for longitudinal modes in a gas laser can vary from a few to hundreds of MHz.

As alluded to above, when the cavity length is varied, e.g., by displacing a mirror that determines the cavity length, the laser wavelength is also shifted. Using the above as an example, one may assume a laser with a one-meter long cavity operating at $2.830185 \times 10^{13}$ Hz, and with a value of n=188,679. If the cavity length is increased by one micrometer, the laser frequency will shift (ΔF) to $2.83018216981783 \times 10^{13}$ Hz, and the laser frequency shift will be approximately 28.3 MHz. The shift in laser frequency (ΔF) is approximated by:

$$\Delta F = -F(\Delta L/L) \qquad \text{Eq. (19)}$$

where F is laser frequency before a change of length of ΔL in the cavity length L.

From this example, it should be evident that it is possible to significantly change the laser frequency with minute changes in the cavity length.

Thus, the invention may exploit the above effect to intentionally destroy the interference effects from two (or more) lasers, each laser having a cavity length determined in part by a mirror position. For example, the rear mirror of one laser may be held steady and the rear mirrors of the other lasers are continuously displaced, each at a different frequency. The amplitude displacement of the mirror determines the amount of shift in the laser center wavelength for each laser and the rate of this displacement will determine how quickly the center wavelength moves. The minimum condition for avoiding interference effects may be achieved by choosing a mirror displacement frequency that differs from cavity to cavity by 1/D where D is the dwell time or the time the laser beam takes to traverse a point on the substrate. That is, $$\Delta f \gtrsim 1/D \qquad \text{Eq. (20)}$$

where Δf is the minimum shift in frequency from one laser mirror driver to the next, and D is the dwell time of the laser beam on a point on the substrate.

The minimum displacement amplitude of each mirror should be sufficient to produce a laser output frequency shift of about 9000(Δf) so that the proportion of time when the output frequencies of any two lasers coincide is a small proportion, ~3%, of the dwell time. This yields the following formula:

$$\Delta L \gtrsim 9000 L\lambda/Dc \qquad \text{Eq. (21)}$$

In an exemplary application using a laser with a one meter cavity length, a 10.6 micrometer output wavelength, and a 1 millisecond dwell time, the minimum driver oscillation amplitude works out to be 0.32 micrometers, which corresponds to a 9 MHz oscillation in the laser output frequency.

There should be no harm in employing amplitudes much larger than this and up to one quarter of the laser wavelength. For example, if two lasers are employed then one laser cavity could be left unmodulated, and the other might be modulated at 1 KHz or higher frequency with an amplitude of 0.5 micrometer. This is a relatively easy task.

Thus, it is apparent that it may be a straightforward matter to avoid coherence effects between multiple lasers within the dwell times of current interest for rapid thermal processing applications, e.g., on the order of 1 ms, 10 μs, 100 ns, 10 ns, or less.

Other techniques for addressing interference issues are available as well. For example, one may drive two or more cavity mirrors at the same frequency 90° out of phase with each other so that when one laser is stable in frequency the other is rapidly changing. In addition, it should be possible to destroy the coherence of a laser by increasing the number of transverse modes in the laser (i.e., increasing the value $M^2$ of the laser). This is possible for certain classes of lasers, like solid state lasers. See, e.g., U.S. Pat. No. 6,366,308 to Hawryluk et al. This approach, however, may not be practical using long gas lasers with few transverse modes.

Thus, variations of the present invention will be apparent to those of ordinary skill in the art. For example, the optical system of the invention may employ a combination of any means known in the art for manipulating photonic beams. While the discussion above regarding apodization technologies generally focuses on various reflective beam forming means, refractive and/or diffractive beam forming means may be used as well. In addition, while the invention has been described in great detail in the context of one or two beam applications, the invention is not limited to any particular number of photonic beams.

Upon routine experimentation, those skilled in the art may find that the invention may be incorporated into existing equipment. For example, an adjustable aspheric mirror may be used to replace a fold mirror of existing equipment. In addition, auxiliary subsystems known in the art may be used to stabilize the position and the width of the laser beam relative to the optical system.

Furthermore, it should be emphasized that a temperature-feedback-based controller, e.g., a servo-controller, may be advantageously used. For example, one may measure the temperature profile on a wafer with high resolution and using the measurements to correct the beam profile. In some instances, such temperature measurement corrections may be carried out in real-time. In addition, temperature measurements may be made to generate a high-resolution map reflecting the thermal conditions under which the wafer as processed. For example, a map of the peak temperature reached at each point on the wafer may be generated. Such mapping may be carried out with resolutions in about the millimeter to the micrometer range. Such mapping may provide invaluable insight for further improvements in the art of thermal processing, particularly in the area of quality control and throughput.

It is to be understood that, while the invention has been described in conjunction with the preferred specific embodiments thereof, the foregoing description is intended to illustrate and not limit the scope of the invention. Any aspects of the invention discussed herein may be included or excluded as appropriate. For example, beam combining technologies and beam shaping technologies may be used by themselves or in combination. Other aspects, advantages, and modifications within the scope of the invention will be apparent to those skilled in the art to which the invention pertains.

All patents and patent applications mentioned herein are hereby incorporated by reference in their entireties.

What is claimed is:

1. A method for processing a semiconductor substrate, the method comprising the steps of:
    (a) generating at least one photonic beam capable of forming a putative unmodified image having a substantially uniform intensity profile over a useful portion thereof on the substrate surface, wherein the useful portion of putative unmodified image has an energy utilization;
    (b) modifying the intensity profile of the at least one photonic beam to form an actual image on a surface of the substrate, the image having a substantially uniform intensity profile over a useful portion thereof, wherein the useful portion of the actual image has an energy utilization that is at least 30% greater than the energy utilization of a useful portion of the putative unmodified image; and
    (c) scanning the image across the substrate surface to heat at least a portion of the substrate at and/or near the surface to achieve a desired temperature within a predetermined dwell time, D.

2. The method of claim 1, wherein the energy utilization of the actual image is at least 100% greater than the energy utilization of the putative unmodified image.

3. A method for processing a semiconductor substrate, the method comprising the steps of:
    (a) generating two or more photonic beams, wherein at least one beam has a nonuniform intensity profile;
    (b) combining the beams in a substantially coherently non-interfering manner to form a contiguous image exhibiting a substantially uniform intensity profile over a useful portion thereof on a surface of the substrate; and
    (c) scanning the image across the surface of the substrate to heat at least a portion of the substrate at and/or near the surface to achieve a desired surface temperature within a predetermined dwell time, D.

4. The method of claim 3, wherein each beam has a wavelength that is locked relative to the wavelength of another beam so that all beams have a small wavelength difference.

5. The method of claim 3, wherein each beam has a wavelength and all wavelengths or all wavelengths but one are varied in such a way as to effectively reduce the occurrence and/or duration of strong interference effects between any two beams to a time span of no more than 0.03 D.

6. The method of claim 5, wherein the at least one wavelength is varied in a sinusoidal manner.

7. The method of claim 5, wherein a single beam has a wavelength that is not varied.

8. The method of claim 3, wherein the image has a peak intensity within the useful portion thereof and the substantially uniform intensity profile is entirely within a range of about 98% to 100% of the peak intensity.

9. The method of claim 8, wherein the substantially uniform intensity profile is entirely within a range of 99% to 100% of the peak intensity.

10. A method for processing a semiconductor substrate, the method comprising the steps of:
    (a) generating two or more photonic beams, wherein each beam is capable of forming a corresponding putative image having a substantially uniform intensity profile over a useful portion thereof on the substrate surface and the useful portions of the putative images have a total energy utilization;
    (b) combining the beams in a substantially coherently non-interfering manner to form a contiguous image for heating a surface of the substrate, wherein the contiguous image has a substantially uniform intensity profile over a useful portion thereof and the useful portion of the contiguous image has an energy utilization that is at least 30% greater than the total energy utilization of the useful portions of the putative images; and
    (c) scanning the contiguous image across the surface of the substrate to heat at least a portion of the substrate at and/or near the surface to achieve a desired temperature within a predetermined dwell time, D.

11. The method of claim 10, wherein the energy utilization of the useful portion of the contiguous image is at least 100% greater than the total energy utilization of the useful portions of the putative images.

* * * * *